United States Patent
Nakakubo

(10) Patent No.: US 8,284,619 B2
(45) Date of Patent: Oct. 9, 2012

(54) SEMICONDUCTOR INTEGRATED CIRCUIT AND SYSTEM

(75) Inventor: Atsushi Nakakubo, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 1091 days.

(21) Appl. No.: 12/134,843

(22) Filed: Jun. 6, 2008

(65) Prior Publication Data

US 2008/0303494 A1    Dec. 11, 2008

(30) Foreign Application Priority Data

Jun. 8, 2007    (JP) ................................ 2007-152390

(51) Int. Cl.
*G11C 5/14*    (2006.01)

(52) U.S. Cl. ..................... 365/189.09; 365/191; 365/226

(58) Field of Classification Search ........................ None
See application file for complete search history.

(56) References Cited

U.S. PATENT DOCUMENTS

| | | | | |
|---|---|---|---|---|
| 5,689,460 A | * | 11/1997 | Ooishi | 365/189.07 |
| 6,064,327 A | * | 5/2000 | Ryoho et al. | 341/154 |
| 7,099,190 B2 | * | 8/2006 | Noguchi et al. | 365/185.09 |

FOREIGN PATENT DOCUMENTS

| | | |
|---|---|---|
| JP | 05-334879 A | 12/1993 |
| JP | 2003-059260 A | 2/2003 |
| JP | 2003-243516 A | 8/2003 |
| WO | WO 2007/014461 A1 | 2/2007 |

* cited by examiner

*Primary Examiner* — Alexander Sofocleous
(74) *Attorney, Agent, or Firm* — Fujitsu Patent Center

(57) ABSTRACT

An internal circuit has a plurality of circuit blocks operating by receiving an internal power supply voltage. An internal voltage control circuit generates a plurality of regulator control signals according to a combination of operating circuit blocks. A plurality of regulators operate in response to activation of the regulator control signals respectively to generate the internal power supply voltage by using an external power supply voltage. For example, as the number of the operating circuit blocks increases, the number of the operating regulators increases. By thus generating the regulator control signals according to the actual operation of the internal circuit to control the operations of the regulators, it is possible to reduce variation in the internal power supply voltage to a minimum. As a result, an operating margin of a semiconductor integrated circuit can be improved and a yield of the semiconductor integrated circuit can be improved.

7 Claims, 25 Drawing Sheets

| | RGL1 (SW1) | RGL2 (SW2) | RGL3 (SW3) | RGL4 (SW4) | RES1 (SW5) | RES2 (SW6) |
|---|---|---|---|---|---|---|
| STBY | ON | OFF | OFF | OFF | OFF | ON |
| REF | ON | ON | ON | ON | OFF | OFF |
| RE — REST | ON | ON | ON | ON | OFF | OFF |
| RE — CL | ON | ON | ON | ON | OFF | OFF |
| RE — SAON | ON | ON | OFF | OFF | ON | OFF |
| WR, SRE, SWR | ON | OFF | OFF | OFF | ON | OFF |
| DPD | OFF | OFF | OFF | OFF | OFF | OFF |
| PON | ON | ON | ON | ON | OFF | OFF |
| BI | ON | ON | ON | ON | OFF | OFF |

Fig. 4

SEMICONDUCTOR INTEGRATED CIRCUIT AND SYSTEM

CROSS-REFERENCE TO RELATED APPLICATION

This application is based upon and claims the benefit of priority from Japanese Patent Application No. 2007-152390, filed on Jun. 8, 2007, the entire contents of which are incorporated herein by reference.

BACKGROUND

1. Field

The present embodiments relate to a semiconductor integrated circuit having an internal voltage generation circuit generating an internal power supply voltage by using an external power supply voltage.

2. Description of the Related Art

Generally, in a semiconductor integrated circuit such as a semiconductor memory, an internal circuit is operated by an internal power supply voltage which is generated by stepping down an external power supply voltage. Current consumption of the internal circuit varies according to an operation state of the circuit. Therefore, as the current consumption increases, the internal power supply voltage decreases, and as the current consumption decreases, the internal power supply voltage increases. Japanese Laid-open Patent Publication No. 5-334879 and Japanese Laid-open Patent Publication No. 2003-59260 disclose art for preventing the variation in the internal power supply voltage.

SUMMARY

According to one aspect of an embodiment, a semiconductor integrated circuit is provided which comprises an internal circuit having a plurality of circuit blocks operating by receiving an internal power supply voltage, an internal voltage control circuit generating a plurality of regulator control signals according to a combination of operating circuit blocks, and an internal voltage generation circuit having a plurality of regulators which operate in response to activation of the respective regulator control signals to generate the internal power supply voltage by using an external power supply voltage.

BRIEF DESCRIPTION OF THE DRAWINGS

FIG. 4 is an explanatory chart illustrating operations of the internal voltage generation circuit illustrated in FIG. 3.

DETAILED DESCRIPTION OF THE EMBODIMENTS

Figure 1:
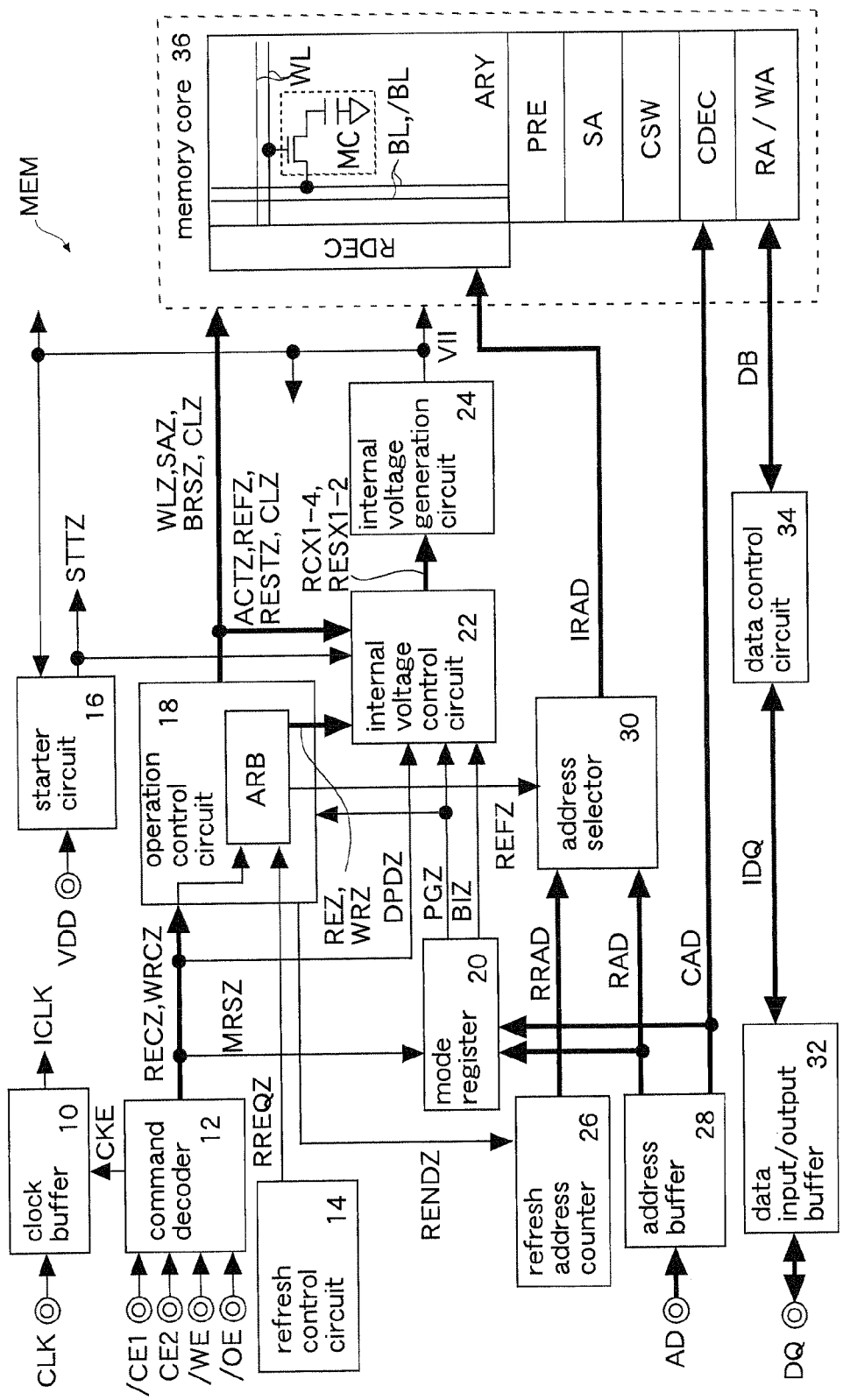
FIG. 1 is a block diagram illustrating a first embodiment.

Hereinafter, embodiments will be described, using the drawings. In the drawings, each signal line shown by the heavy line is constituted of a plurality of lines. Part of blocks to which the heavy lines are connected is constituted of a plurality of circuits. Each signal line through which the signal is transmitted is denoted by the same reference symbol as the signal name. Each signal starting with "/" or ending with "X" represents negative logic. Each signal ending with "Z" represents positive logic. Each double circle in the drawings represents an external terminal.

FIG. 1 illustrates a first embodiment. A semiconductor memory MEM (semiconductor integrated circuit) is a FCRAM (Fast Cycle RAM) of a clock synchronous type, for instance. This FCRAM, which is a pseudo SRAM, has memory cells of a DRAM and an interface of a SRAM. The memory MEM has a clock buffer 10, a command decoder 12, a refresh control circuit 14, a starter circuit 16, an operation control circuit 18, a mode register 20, an internal voltage control circuit 22, an internal voltage generation circuit 24, a refresh address counter 26, an address buffer 28, an address selector 30, a data input/output buffer 32, a data control circuit 34, and a memory core 36 (internal circuit).

The clock buffer 10 outputs a clock signal CLK as an internal clock signal ICLK when logic level of a clock enable signal CKE is high. The internal clock signal ICLK is supplied to circuits operating in synchronization with the clock signal CLK, such as the command decoder 12, the address buffer 28, the data input/output buffer 32, the mode register 20, and the operation control circuit 18.

The command decoder 12 outputs a command (access request) recognized according to logic levels of a first chip enable signal /CE1, a second chip enable signal CE2, a write enable signal /WE, and an output enable signal/OE, as a clock enable signal CKE causing the clock buffer 10 to output the internal clock signal ICLK, a deep power-down signal DPDZ for causing the internal voltage control circuit 22 to execute a deep power-down mode DPD, a read command signal RECZ (read command), a write command signal WRCZ (write command), and a mode register set signal MRSZ (mode register set command) which cause the execution of an access operation of the memory core 36, and so forth. In response to low logic level of the second chip enable signal CE2, the memory MEM stops the operation of its internal circuits, and the internal voltage control circuit 22 enters the deep power-down mode in which all regulators of the internal voltage generation circuit 24 are stopped. In response to a change of the second chip enable signal CE2 to high logic level, the internal voltage control circuit 22 exits from the deep power-down mode to return to a normal operation mode. The read command RECZ and the write command WRCZ are external access requests for access operations to the memory core 36. The first chip enable signal /CE1 is supplied to set the memory MEM active.

Figure 12:
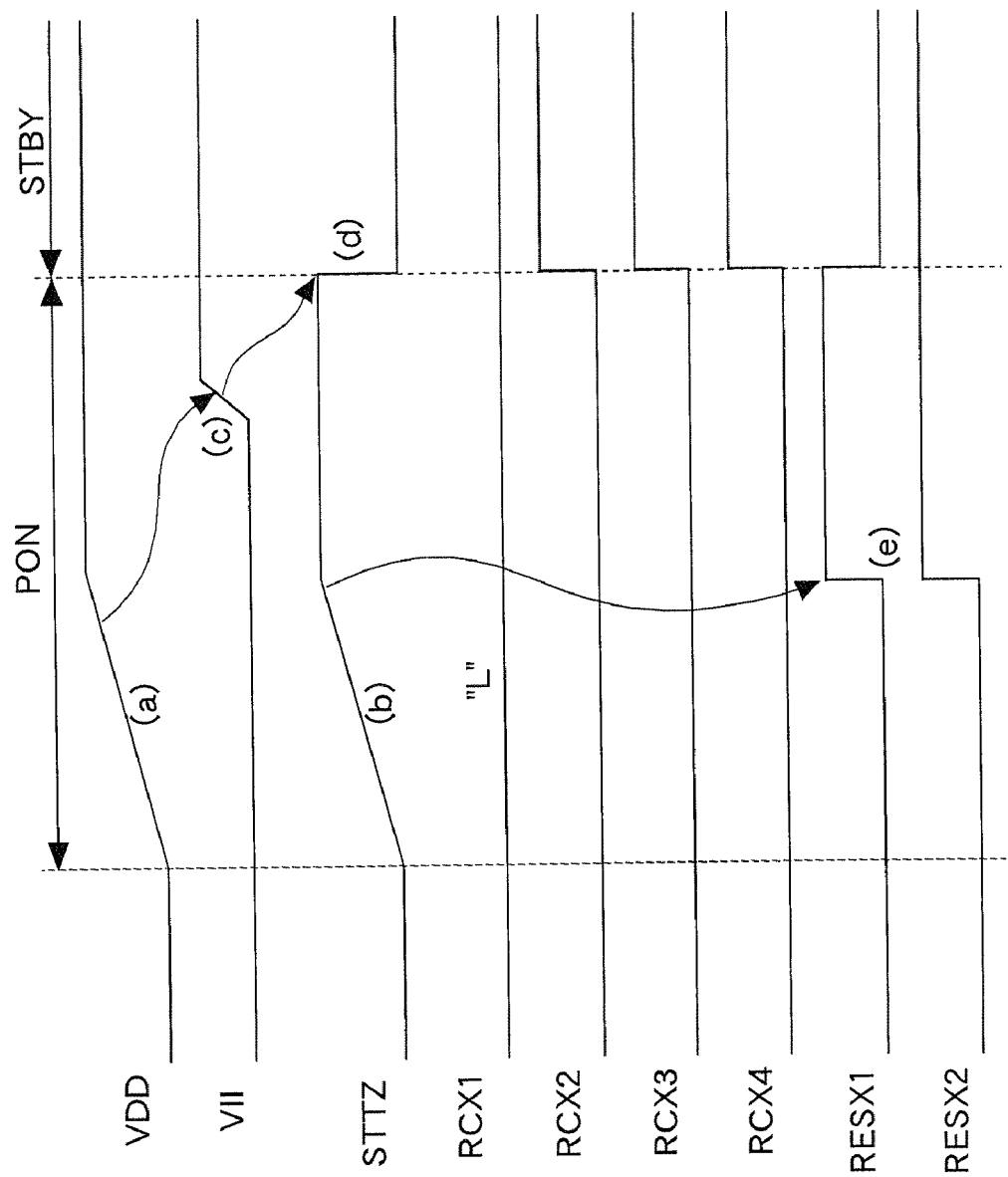
FIG. 12 is a timing chart illustrating operations at the power-on time of the first embodiment.

The refresh control circuit 14 has an oscillator outputting a refresh request signal RREQZ at a predetermined cycle. Upon power-on of the memory MEM, the starter circuit 16 outputs a starter signal STTZ based on an external power supply voltage VDD and an internal power supply voltage VII in order to reset internal circuits such as latches requiring resetting. Operations at the power-on time (PON) are illustrated in FIG. 12.

The operation control circuit 18 outputs a plurality of kinds of operation control signals (a word activation signal WLZ, a sense amplifier activation signal SAZ, a precharge control signal BRSZ, a column activation signal CLZ, an activation signal ACTZ, a read command signal REZ, a write command signal WRZ, a refresh signal REFZ, and a restore signal RESTZ) controlling operations of circuit blocks such as a row decoder RDEC, a sense amplifier SA, and a column switch CSW, in order to cause the memory core 36 to execute a read operation, a write operation, and a refresh operation in response to the read command RECZ, the write command WRCZ, and the refresh request RREQZ. The word activation signal WLZ controls the activation timing of a word line WL, and the sense amplifier activation signal SAZ controls the activation timing of the sense amplifier SA. The precharge control signal BRSZ controls ON/OFF of a precharge circuit PRE. The column activation signal CLZ controls ON/OFF of the column switch CSW. The activation signal ACTZ is activated in response to the activation of the first chip enable signal /CE1. The refresh signal REFZ is activated when the refresh operation is to be executed. The restore signal RESTZ is activated when data held in the memory cell MC is rewritten. The restore signal RESTZ is kept active during a predetermined period starting from rising edges of the word activation signal WLZ and the sense amplifier activation signal SAZ which are generated in response to the external access requests RECZ, WRCZ.

An arbiter ARB of the operation control circuit 18 decides which of the external access requests RECZ, WRCZ or the refresh request RREQZ should be given priority when they conflict with each other. For example, when the refresh request RREQZ is supplied during a read operation, the arbiter ARB withholds a refresh operation responding to the refresh request RREQZ until the read operation is completed. At this time, the refresh signal REFZ is activated in response to the inactivation of the read command signal REZ (the completion of the read operation) and is kept active for a predetermined period. On the other hand, when the read command RECZ is supplied during a refresh operation, a read operation responding to the read command RECZ is withheld until the refresh signal REFZ is inactivated after the refresh operation responding to the refresh request RREQZ is completed. Then, the arbiter ARB activates the read command signal REZ when the read operation is to be executed. The same applies to the write command WRCZ. The arbiter ARB activates the write command signal WRZ when a write operation is to be executed.

The mode register 20 is set according to a level of an address signal AD supplied with the mode register set signal MRSZ. For example, the mode register 20 sets a page operation mode (synchronous operation mode) or a burn-in mode (test mode). The mode register 20 activates a page signal PGZ when the page operation mode is set and activates a burn-in signal BIZ when the burn-in mode is set.

Figure 9:
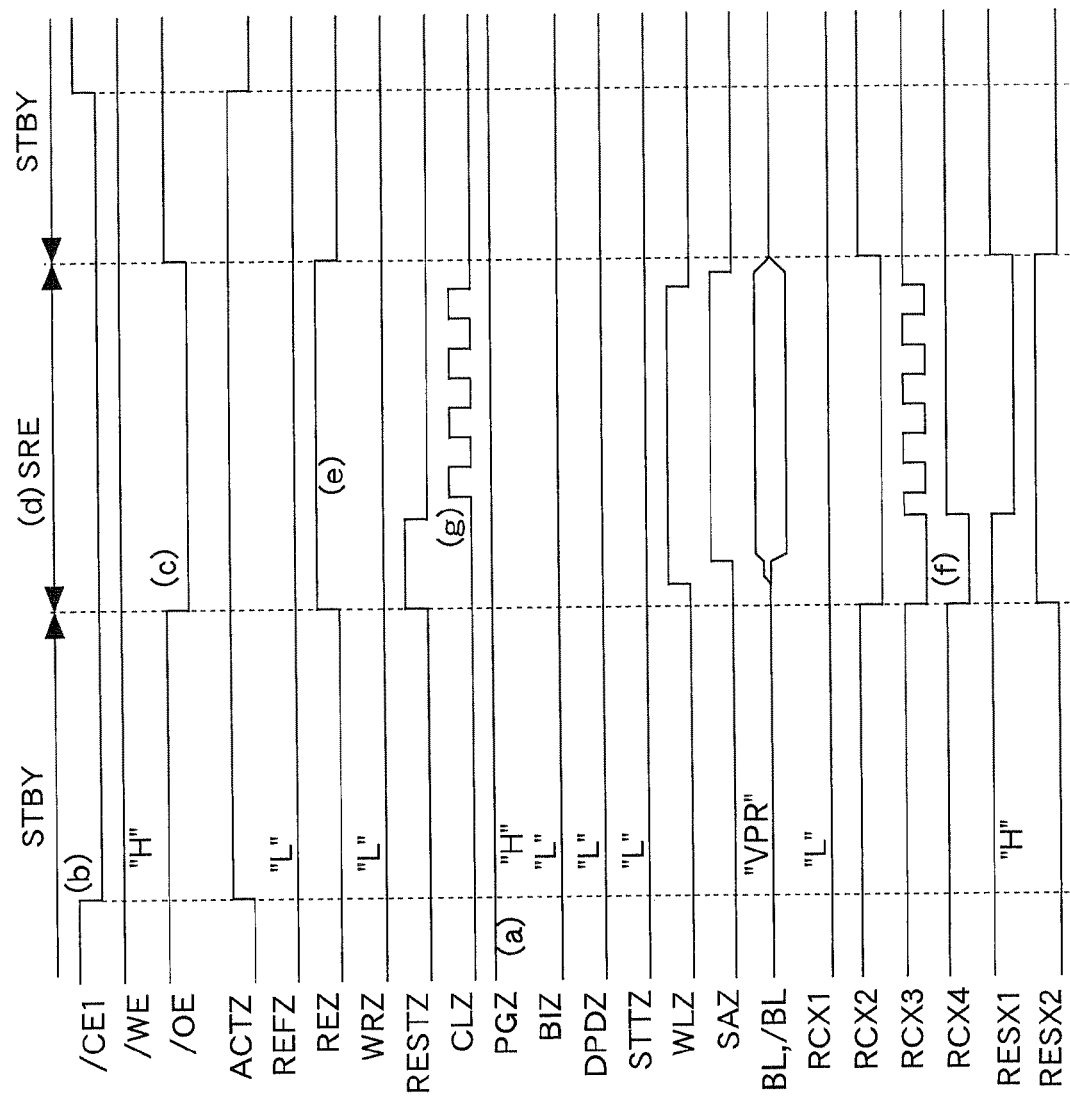
FIG. 9 is a timing chart illustrating a synchronous read operation of the first embodiment.
Figure 13:
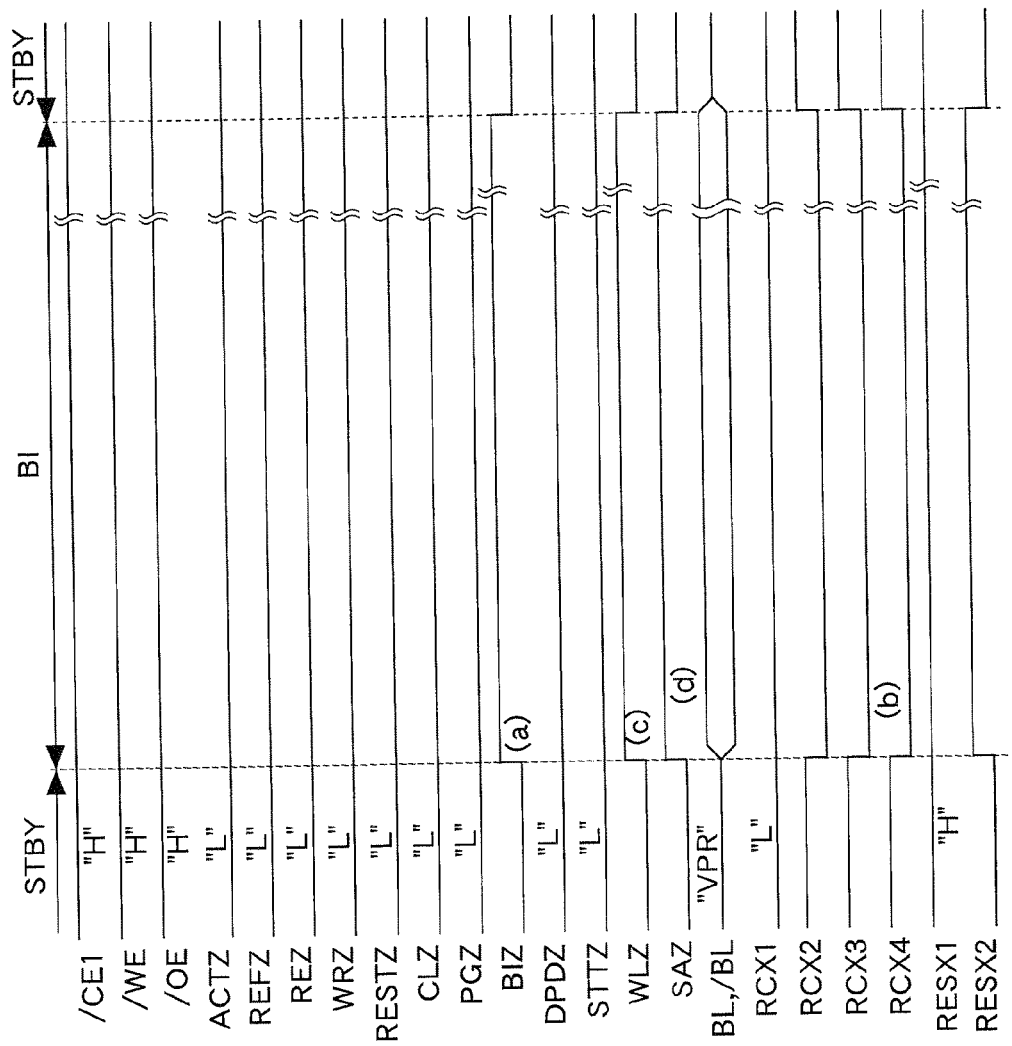
FIG. 13 is a timing chart illustrating operations in a burn-in test of the first embodiment.

In the page operation mode, at the time of the read operation, a data signal DQ is output a plurality of times from the memory MEM in response to one supply of the read command signal REZ. At the time of the write operation, a data signal DQ is supplied to the memory MEM a plurality of times in response to one supply of the write command signal WRZ. Incidentally, operating specifications of the memory MEM such as burst length and data latency may be set in the mode register 20. The burst length is the number of times data is output from a data terminal DQ in response to one supply of the read command signal REZ, and the number of times data is received at the data terminal DQ in response to one supply of the write command signal WRZ. The burst length set in the mode register 20 becomes valid in the page operation mode. In the page operation mode, a burst access operation (a synchronous read operation and a synchronous write operation) is executed. In operation modes except the page operation mode, a single access operation (an asynchronous read operation and an asynchronous write operation) is executed. The data latency CL is the number of cycles in a period from the receipt of the read command RECZ to the output of the first read data DQ. Details of the page operation mode (synchronous read operation SRE, synchronous write operation SWR), the deep power-down mode DPD, and the burn-in mode BI are illustrated in FIG. 9-FIG. 1, and FIG. 13.

Figure 2:
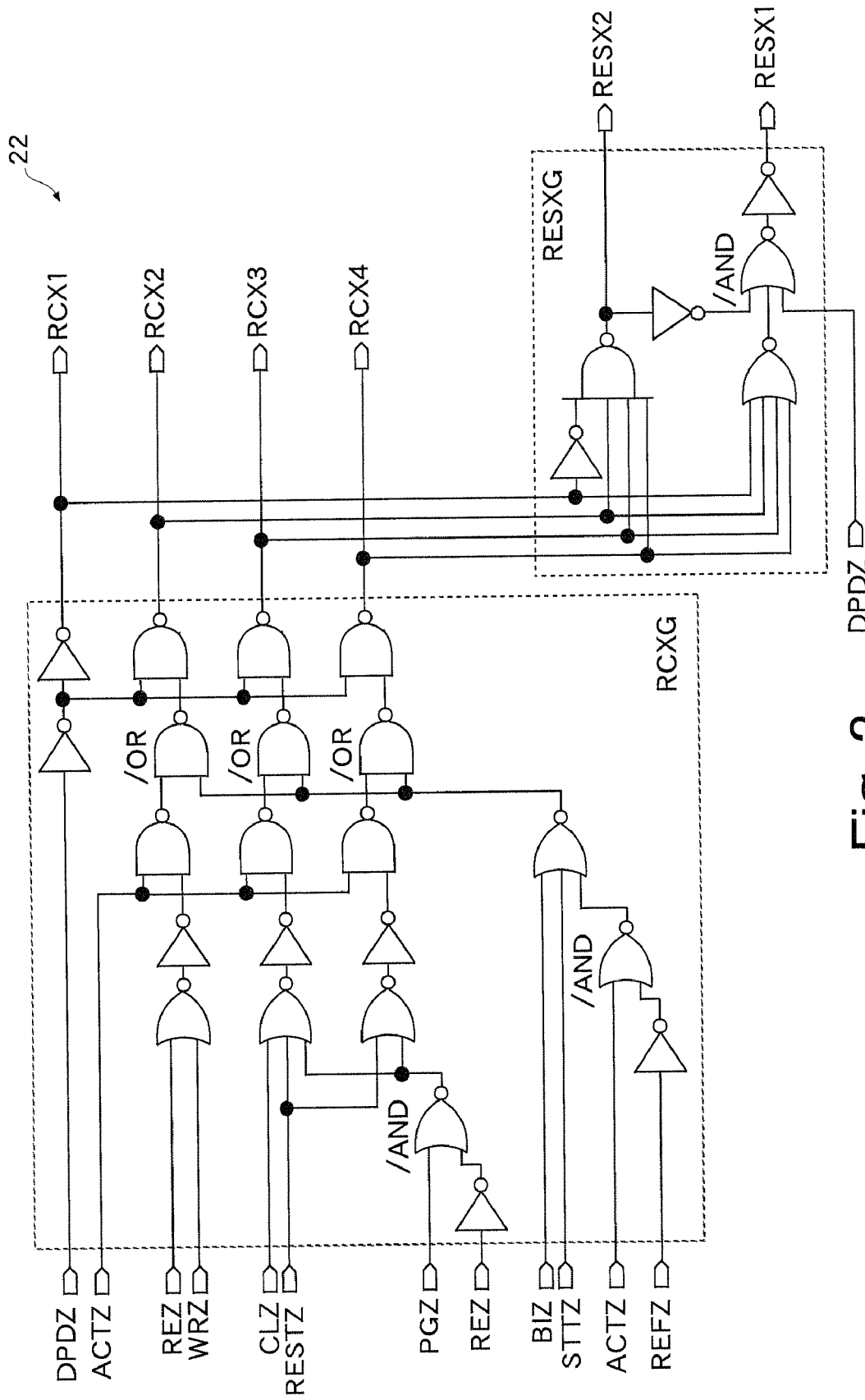
FIG. 2 is a circuit diagram illustrating an internal voltage control circuit illustrated in FIG. 1.

The internal voltage control circuit 22 operates by receiving the external power supply voltage VDD and outputs regulator control signals RCX (RCX1-4) and resistor control signals RESX (RESX1-2; load control signals) which control the generation of the internal power supply voltage VII, according to the command signals REZ, WRZ (access request), the operation mode control signals PGZ, DPDZ, BIZ, the operation control signals ACTZ, RESTZ, CLZ, and the refresh signal REFZ (refresh request)). Details of the internal voltage control circuit are illustrated in FIG. 2.

Figure 3:
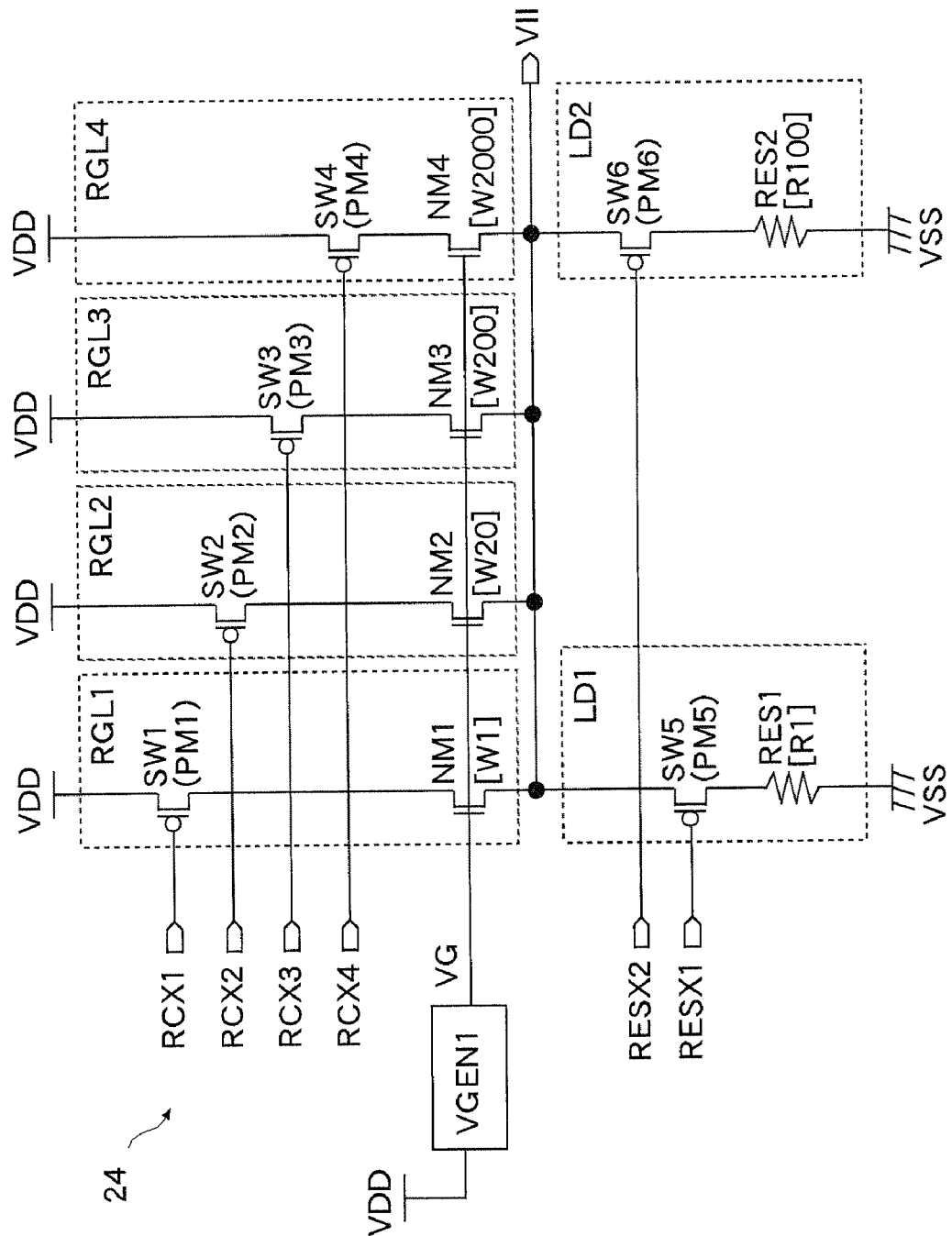
FIG. 3 is a circuit diagram illustrating an internal voltage generation circuit illustrated in FIG. 1.

The internal voltage generation circuit 24 generates the internal power supply voltage VII according to the regulator control signals RCX1-4 and the resistor control signals RESX1-2. The internal power supply voltage VII is used as a high-level voltage of bit lines BL, /BL and power supply voltages of the operation control circuit 18, the mode register 20, the address selector 30, a data control circuit 34, and so on. Details of the internal voltage generation circuit 24 are illustrated in FIG. 3 and FIG. 4.

The refresh address counter 26 sequentially generates a refresh address signal RRAD in synchronization with a refresh end signal RENDZ indicating the end of a refresh operation. The refresh address RRAD is a row address signal for selecting a word line WL. When receiving the address signal AD, the address buffer 28 outputs the received address as a row address signal RAD and a column address signal CAD. In this embodiment, the row address signal RAD and the column address signal CAD are received at dedicated address terminals AD respectively. That is, the row address signal RAD and the column address signal CAD are simultaneously supplied with the read command RECZ or the write command WRCZ. The row address signal RAD is supplied for selecting a word line WL. The column address signal CAD is supplied for selecting bit lines BL, /BL.

The address selector 30 selects the refresh address signal RRAD when the refresh operation is to be executed (REFZ=H), while selecting the row address signal RAD when the refresh operation is not to be executed (REFZ=L), and outputs the selected signal as an internal row address signal IRAD to the memory core 36.

When receiving a write data signal via the data terminal DQ, the data input/output buffer 32 outputs the received data signal to a data bus DB. Further, when receiving a read data signal from a memory cell MC via the data bus DB, the data input/output buffer 32 outputs the received data signal to the data terminal DQ. During a write operation, the data control circuit 34 converts serial internal data signals IDQ (write data) into parallel data to output the parallel data to the data bus DB. During a read operation, the data control circuit 34 converts parallel read data on the data bus DB into serial data to output the serial data as the internal data signal IDQ. For example, a bit width of the data bus DB is twice as large as a bit width of the data terminal DQ (16 data terminals and a 32-bit data bus).

The memory core 36 has a memory cell array ARY, the row decoder RDEC, the precharge circuit PRE, the sense amplifier SA, the column switch CSW, a column decoder CDEC, a read amplifier RA, and a write amplifier WA. The memory cell array ARY, the row decoder RDEC, the precharge circuit RPE, the sense amplifier SA, the column switch CSW, the column decoder CDEC, the read amplifier RA, and the write amplifier WA are circuit blocks forming the memory core 36.

The memory cell array ARY has a plurality of dynamic memory cells MC, a plurality of word lines WL each coupled to an array of the memory cells MC disposed in line in the horizontal direction in FIG. 1, a plurality of bit lines BL, /BL each coupled to an array of the memory cells MC disposed in line in the vertical direction in FIG. 1. Each of the memory cells MC has a capacitor for holding data as an electric charge and a transfer transistor for coupling one end of the capacitor to the bit line BL (or /BL). The other end of the capacitor is coupled to a precharge voltage line. A gate of the transfer transistor is coupled to the word line WL. Upon selection of the word line WL, one of a read operation, a write operation, and a refresh operation is executed.

The row decoder RDEC decodes the internal row address signal IRAD in order to select one of the word lines WL and supplies a high-level voltage (for example, a boosted voltage) to the selected word line WL. That is, the row decoder RDEC has a function of a word driver driving the word line WL. The precharge circuit PRE couples the bit line pair BL, /BL to the precharge voltage line in synchronization with the precharge control signal BRSZ during a non-access period of the memory cells MC. The sense amplifier SA is coupled to the bit line pair BL, /BL and in synchronization with the sense amplifier activation signal SAZ, amplifies a difference in signal amount of data read to the bit line pair BL, /BL.

The column decoder CDEC decodes the column address signal CAD in order to select the bit line pair BL, /BL to/from which a data signal is to be input/output. The column switch CSW couples the bit lines BL, /BL corresponding to the column address signal CAD to the read amplifier RA or the write amplifier WA, and the data bus DB in synchronization with the column activation signal CLZ. During a read access operation, the read amplifier RA amplifies complementary read data output via the column switch CSW during a write access operation, the write amplifier WA amplifies complementary write data supplied via the data bus DB to supply the resultant to the bit line pair BL, /BL.

FIG. 2 illustrates the internal voltage control circuit 22 illustrated in FIG. 1. The internal voltage control circuit 22 has a generation circuit RCXG generating the regulator control signals RCX (RCX1-4), a generation circuit RESXG generating the resistor control signals RESX (RESX1-2). In FIG. 2, NAND gates appended with /OR have a function as negative-logic OR gates, and OR gates appended with /AND have a function as negative-logic AND gates.

In the generation circuit RCXG, the regulator control signal RCX1 is kept activated to low logic level only while the deep power-down signal DPDZ is inactive. The regulator control signals RCX1-4 are kept inactivated to high logic level while the deep power-down signal DPDZ is active. Further, the regulator control signals RCX2-4 are kept activated to low logic level during an activation period of the burst-in signal BIZ, during an activation period of the starter signal STTZ, or during an activation period of the refresh signal REFZ. Further, the regulator control signal RCX2 is kept activated to low logic level during an activation period of the read command signal REZ or the write command signal WRZ. The regulator control signal RCX3 is kept activated to low logic level during an activation period of the column activation signal CLZ, an activation period of the restore signal RESTZ, or an activation period of the read command signal REZ in the asynchronous read operation. The regulator control signal RCX4 is kept activated to low logic level during an activation period of the restore signal RESTZ or an activation period of the read command signal REZ in the asynchronous read operation.

In the generation circuit RESXG, the resistor control signal RESX1 is kept activated to low logic level during an inactivation period of one of the regulator control signals RCX1-4 while the resistor control signal RESX2 and the deep power-down signal DPDZ are inactive. The resistor control signal RESX2 is kept activated to low logic level during an inactivation period of the regulator control signals RCX2-4 while the regulator control signal RCX1 is active. The resistor control signals RESX1-2 are generated by using the regulator control signals RCX1-4. Generating the resistor control signals RESX1-2 by using logic of the generation circuit RCXG makes it possible to reduce logic scale of the internal voltage control circuit 22. As a result, chip size of the memory MEM can be reduced.

FIG. 3 illustrates the internal voltage generation circuit 24 illustrated in FIG. 1. The internal voltage generation circuit 24 has four regulators RGL1-4 corresponding to the regulator control signals RCX1-4 respectively, a voltage generator VGEN1 generating a constant voltage VG supplied to the regulators RGL1-4, and two load circuits LD1-2 corresponding to the resistor control signals RESX1-2 respectively.

Each of the regulators RGL1-4 has a switch SW (SW1-4) and an nMOS transistor NM (NM1-4) which are disposed in series between an external power supply line VDD and an internal power supply line VII. The transistors NM1-4 have gates coupled to a constant voltage line VG, sources coupled to the internal power supply line VII, and drains coupled to the switches SW1-4 respectively. Numerical values W1, W20, W200, and W2000 appended to the transistors NM1-4 indicate a ratio of gate widths of the transistors NM1-4. The larger the numerical value, the higher the current supply capability. The transistors NM1-4 are equal in channel length. Thus, the regulators RGL1-4 differ in supply capability for supplying a current to the internal power supply line VII to which the internal power supply voltage VII is supplied.

The switches SW1-4 are formed by pMOS transistors PM1-4. The transistors PM1-4 have gates coupled to regulator control signal lines RCX1-4 respectively, sources coupled to the external power supply line VDD, and drains coupled to drains of the transistors NM1-4 respectively. The voltage generator VGEN1 receives the external power supply voltage VDD to generate the constant voltage VG for turning on the transistors NM1-4.

Each of the load circuits LD1-2 has a switch SW (SW5-6) and a resistor element RES (hereinafter, referred to as resistors RES1-2) which are disposed in series between the internal power supply line VII and a ground line VSS. For example, the resistors RES1-2 are formed by using diffusion layers. Numerical values R1 and R100 appended to the resistors RES1-2 indicate a ratio of their resistance. The switches SW5-6 are formed by pMOS transistors PM5-6. The transistors PM5-6 have gates coupled to resistor control signal lines RESX1-2 respectively, sources coupled to the internal power supply line VII, and drains coupled to the resistors RES1-2 respectively.

In the internal voltage generation circuit 24 illustrated in FIG. 3, in response to the activation of the regulator control signals RCX (RCX1-4), the switches SW (SW1-4) turn on and the regulators RGL (RGL1-4) operate. Consequently, a power supply current (electric charge) is supplied to the internal power supply line VII to increase the internal power supply voltage VII. Further, in response to the activation of the resistor control signals RESX (RESX1-2), the switches SW (SW5-6) turn on, so that the internal power supply line VII is coupled to the ground line VSS via the resistors RES (RES1-2). Consequently, the power supply current (electric charge) flows to the ground line VSS from the internal power supply line VII, so that the internal power supply voltage VII lowers.

FIG. 4 illustrates operations of the internal voltage generation circuit 24 illustrated in FIG. 3. In FIG. 4, "ON" indicates the activation of the regulator control signals RCX1-4 or the resistor control signals RESX1-2, and "OFF" indicates the inactivation of the regulator control signals RCX1-4 or the resistor control signals RESX1-2. In other words, "ON"/"OFF" indicates that the switches SW1-6 turn on or off and the current flows to the regulator RGL1-4 or the load circuits LD1-2. In this embodiment, the regulator control signals RCX1-4 and the resistor control signals RESX1-2 are generated in response to the access requests REZ, WRZ, the refresh request REFZ, or the operation control signals RESTZ, CLZ, or the like, as will be described later. The operation control signal RESTZ is generated according to the word activation signal WLZ and the sense amplifier activation signal SAZ as described above.

A standby mode period STBY is a period in which the first chip enable signal /CE1 with high logic level is supplied. In the standby period STBY, current consumption is extremely low since the internal circuits do not operate. At this time, only the regulator RGL1 with the lowest drivability turns on. Further, in order to prevent the internal power supply voltage VII from becoming higher than an expected level, only the load circuit LD2 with the lowest drivability turns on.

In a refresh operation REF responding to the refresh request REFZ and an asynchronous read operation RE responding to the read request REZ, the word line WL and the sense amplifier SA are activated in a short time and a restore operation is executed. In the refresh operation REF and the asynchronous read operation RE, current consumption is high, and therefore, all the regulators RGL1-4 are on and all the load circuits LD1-2 are off. The refresh operation REF is the same as the asynchronous read operation RE except in that data signal on the bit lines BL, /BL is not output to an external part of the memory MEM in the refresh operation REF.

In the asynchronous write operation WR and the synchronous write operation SWR responding to the write request WRZ and in the synchronous read operation SRE responding to the read request REZ, operations of the regulators RGL1-4 and the load circuits LD1-2 are changed according to sub operations included in each of the operations. That is, the regulator control signals RCX1-4 and the resistor control signals RESX1-2 are generated according to the combination of operating circuit blocks.

Concretely, in the restore operation REST in which the row decoder RDEC and the sense amplifier SA start their operations and data read from the memory cell MC is rewritten, all the regulators RGL1-4 are on and all the load circuits LD1-2 are off. In a column operation CL in which the column switch CSW turns on in response to the operation of the column decoder CDEC to couple the bit lines BL, /BL to the data bus DB, the regulators RGL1-3 are on and the load circuit LD1 are on. In the column operation CL, the data input/output buffer 32 and the data control circuit 34 operate in order to input/output the data signal DQ to/from the data terminal. Therefore, current consumption of the column operation CL is higher than current consumption of the standby period STBY and a later-described ON operation SAON of the sense amplifier SA.

During the ON operation SAON of the sense amplifier SA in which neither the restore operation REST nor the column operation CL is executed, in the asynchronous write operation WR, the synchronous read operation SRE, and the synchronous write operation SWR, the regulators RL1-2 are on and the load circuit LD1 is on. The ON operation SAON of the sense amplifier SA is a static period in which the amplified state of a data signal on the bit lines BL, /BL is kept after the data signal is amplified by the sense amplifier SA. Therefore, current consumption of the ON operation SAON of the sense amplifier SA is lower than current consumption of the column operation CL and is higher than current consumption of the standby period STBY.

In the deep power-down mode DPD, all the regulators RGL1-4 are off and all the load circuits LD1-2 are off. Consequently, the generation of the internal power supply voltage VII is stopped and current consumption of the memory MEM is the lowest. In the power-on operation PON, all the regulators RGL1-4 are on and all the load circuits LD1-2 are off in order to quickly increase the internal power supply voltage VII. In the burn-in operation BI, all the regulators RGL1-4 are on and all the load circuits LD1-2 are off in order to give stress to the transistors.

The refresh operation REF is dividable into the restore operation REST and the On operation SAON of the sense amplifier SA, similarly to the synchronous read operation SRE. The asynchronous read operation RE, similarly to the synchronous read operation SRE, is dividable into the restore operation REST, the column operation CL, and the ON operation SAON of the sense amplifier SA. However, in the refresh operation REF and the asynchronous read operation RE, the restore operation REST and the ON operation SAON of the sense amplifier SA (or the column operation CL) are successively executed in a short time. Therefore, only the restore operation REST is executed, and no change of the regulators RGL1-4 and the load circuits LD1-2 take place.

On the other hand, in the asynchronous write operation WR and the synchronous write operation SWR, current consumption during a period after the restore operation REST up to the receipt of write data is low, and current consumption when data on the bit lines BL, /BL is inverted by write data is high. Therefore, the operations of the regulators RGL1-4 and the load circuits LD1-2 are changed more frequently than in the asynchronous read operation RE. In the synchronous read operation SRE, the column operation CL whose current consumption is relatively low take places a plurality of times. In order to optimally set the internal power supply voltage VII according to the current consumption of the plural column operations CL, the operations of the regulators RGL1-4 and the load circuits LD1-2 are more frequently changed than in the asynchronous read operation RE.

Figure 5:
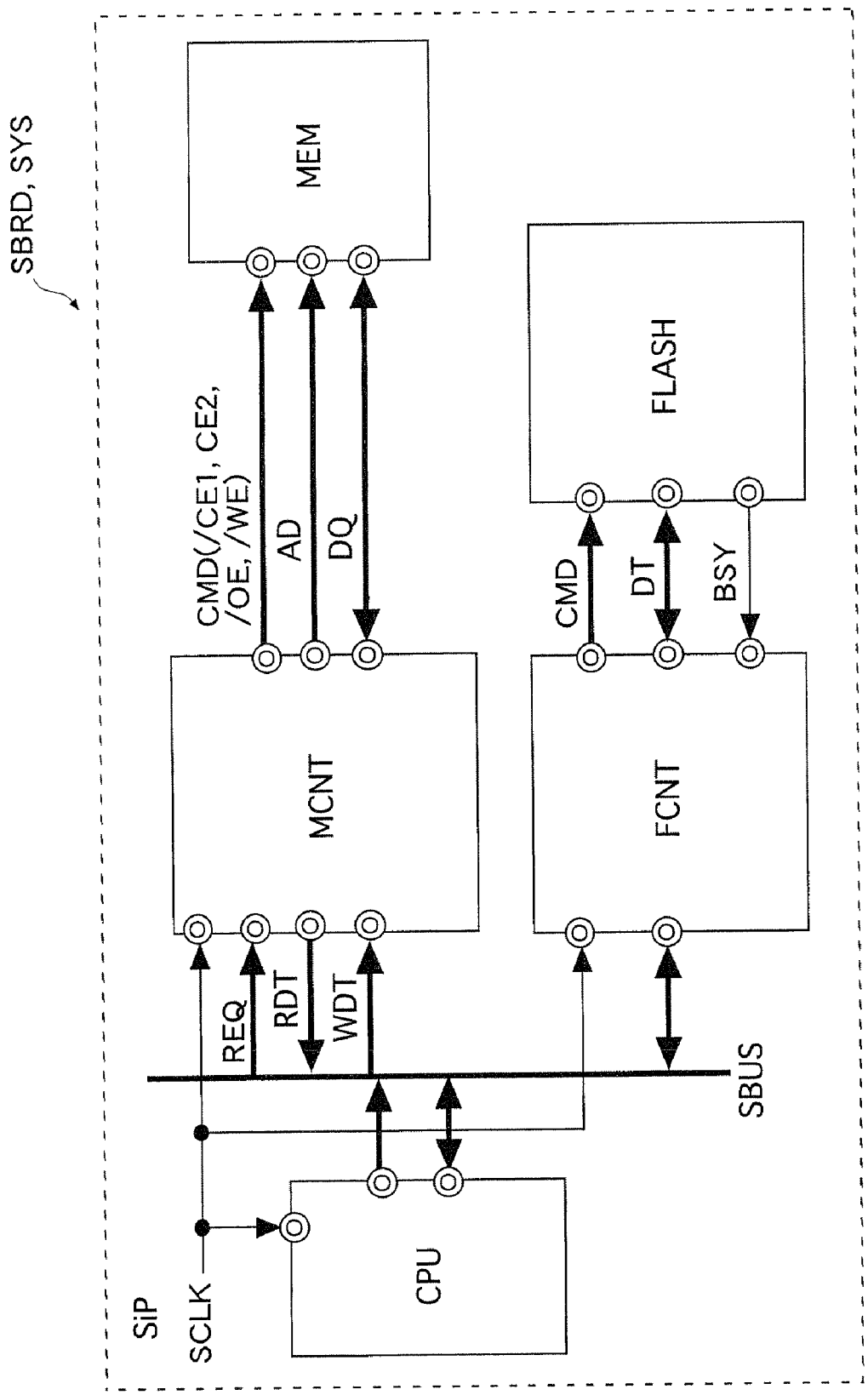
FIG. 5 is a block diagram illustrating a system of the first embodiment.

FIG. 5 illustrates a system SYS of the first embodiment. The system SYS is, for example, a portable equipment such as a mobile phone and has a system board SBRD on which a system in package SiP for controlling the operation of the portable equipment is mounted. The SiP has the memory MEM illustrated in FIG. 1, a memory controller MCNT accessing the memory MEM, a flash memory FLASH, a flash controller FCNT accessing the flash memory FLASH, a CPU (system controller) controlling the whole system, and so on. The CPU, the memory controller MCNT, and the flash controller FCNT are mutually coupled via a system bus SBUS and operate in synchronization with a system clock signal SCLK. If the memory MEM or the flash memory FLASH operates in synchronization with the clock signal CLK, the system clock signal SCLK is supplied as the clock signal CLK to the memory MEM or the flash memory FLASH. The SiP may be coupled to an upper-order system via an external bus.

For example, in this system SYS, a program and data stored in the flash memory FLASH are transferred to the memory MEM upon power-on of the system SYS. Thereafter, the CPU executes the program transferred to the memory MEM in order realize a function of the system SYS and reads data held in the memory MEM or writes data to be held in the memory MEM. The CPU outputs an access request for accessing the memory MEM and a write data signal WDT, and receives a read data signal RDT from the memory MEM. Further, the CPU outputs an access request for accessing the flash memory FLASH.

Figure 6:
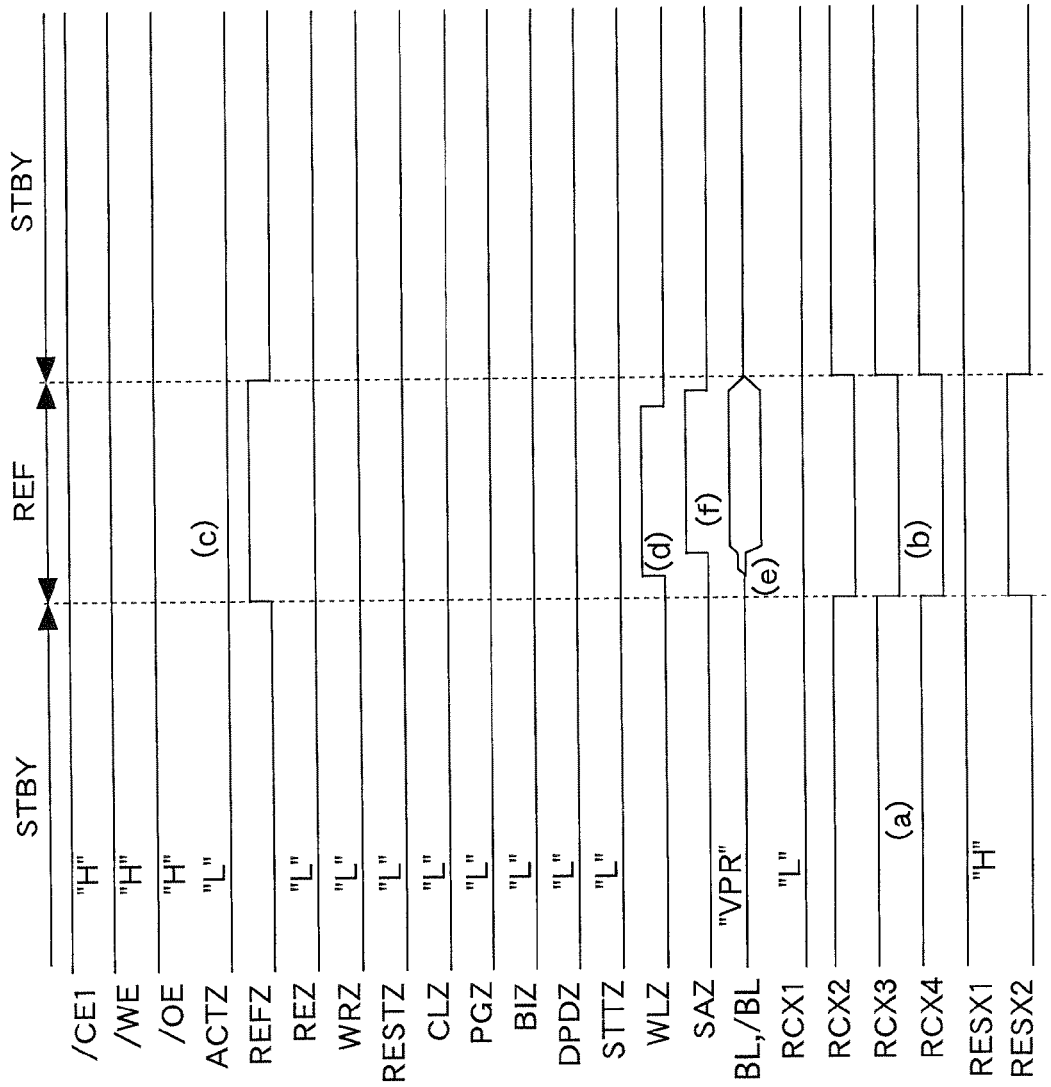
FIG. 6 is a timing chart illustrating a refresh operation of the first embodiment.

FIG. 6 illustrates the refresh operation REF of the first embodiment. In the standby period STBY before the refresh operation REF is executed, the regulator control signal RCX1 and the resistor control signal RESX2 are active (FIG. 6(a)). Further, during the standby period STBY, the bit line pair BL, /BL is set to a precharge voltage VPR. The standby period STBY is a period in which the first chip enable signal /CE1 is inactive. In the standby period STBY, levels of the write enable signal /WE and the output enable signal /OE may be either high logic level H or low logic level L.

In synchronization with the activation of the refresh signal REFZ, the internal voltage control circuit 22 activates the regulator control signals RCX1-4 and inactivates the resistor control signals RESX1-2 (FIG. 6(b)). Since the refresh operation REF is executed in response to the refresh request signal RREQZ generated internally in the memory MEM, the activation signal ACTZ is not activated (FIG. 6(c)). One of the word lines WL is activated in synchronization with the word activation signal WLZ (FIG. 6(d)). In response to the activation of the word line WL, data is read from the memory cell MC to the bit line BL or /BL (FIG. 6(e)). Next, the sense amplifier SA starts an amplification operation in synchronization with the sense amplifier activation signal SAZ to amplify a voltage difference between the bit line pair BL, /BL (FIG. 6(f)). Then, read data signal amplified on the bit lines BL, /BL is rewritten back to the memory cell MC. That is, the restore operation is executed and the refresh operation REF is completed.

Figure 7:
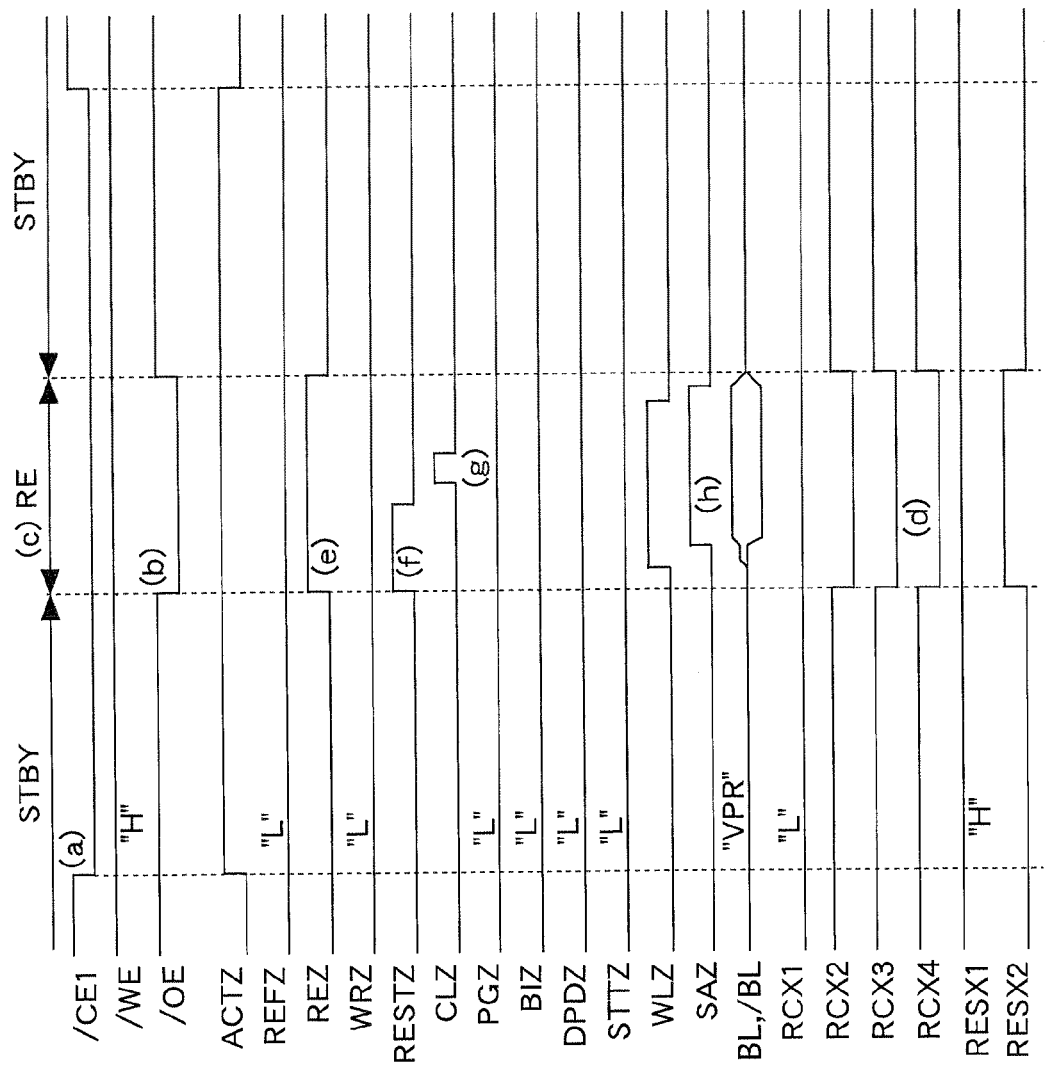
FIG. 7 is a timing chart illustrating an asynchronous read operation of the first embodiment.

FIG. 7 illustrates the asynchronous read operation RE of the first embodiment. In the asynchronous read operation RE, the memory controller MCNT illustrated in FIG. 5 first activates the first chip enable signal /CE1 (FIG. 7(a)). The activation of the first chip enable signal /CE1 brings the memory MEM into an active standby state. Next, the memory controller MCNT activates the output enable signal /OE (FIG. 7(b)). Since the page signal PGZ is inactive, the memory MEM starts the asynchronous read operation RE in synchronization with the activation of the output enable signal /OE (FIG. 7(c)). During the asynchronous read operation RE, the regulator control signals RCX1-4 are active and the resistor control signals RESX1-2 are inactive (FIG. 7d)).

In the asynchronous read operation RE, the read command REZ is kept active during an activation period of the output enable signal /OE (FIG. 7(e)). First, the restore operation REST is executed as in the refresh operation REF illustrated in FIG. 6. During the execution of the restore operation REST, the restore signal RESTZ is active (FIG. 7(f)). Next, the column activation signal CLZ is activated to turn on the column switch CSW, so that the column operation CL is executed (FIG. 7(g)). In the column operation CL, the read data signal on the bit line pair BL, /BL amplified by the sense amplifier SA is output to the data terminal DQ. Waveforms of the word activation signal WLZ, the sense amplifier activation signal SAZ, and the bit line pair BL, /BL are the same as those in the refresh operation REF.

Figure 8:
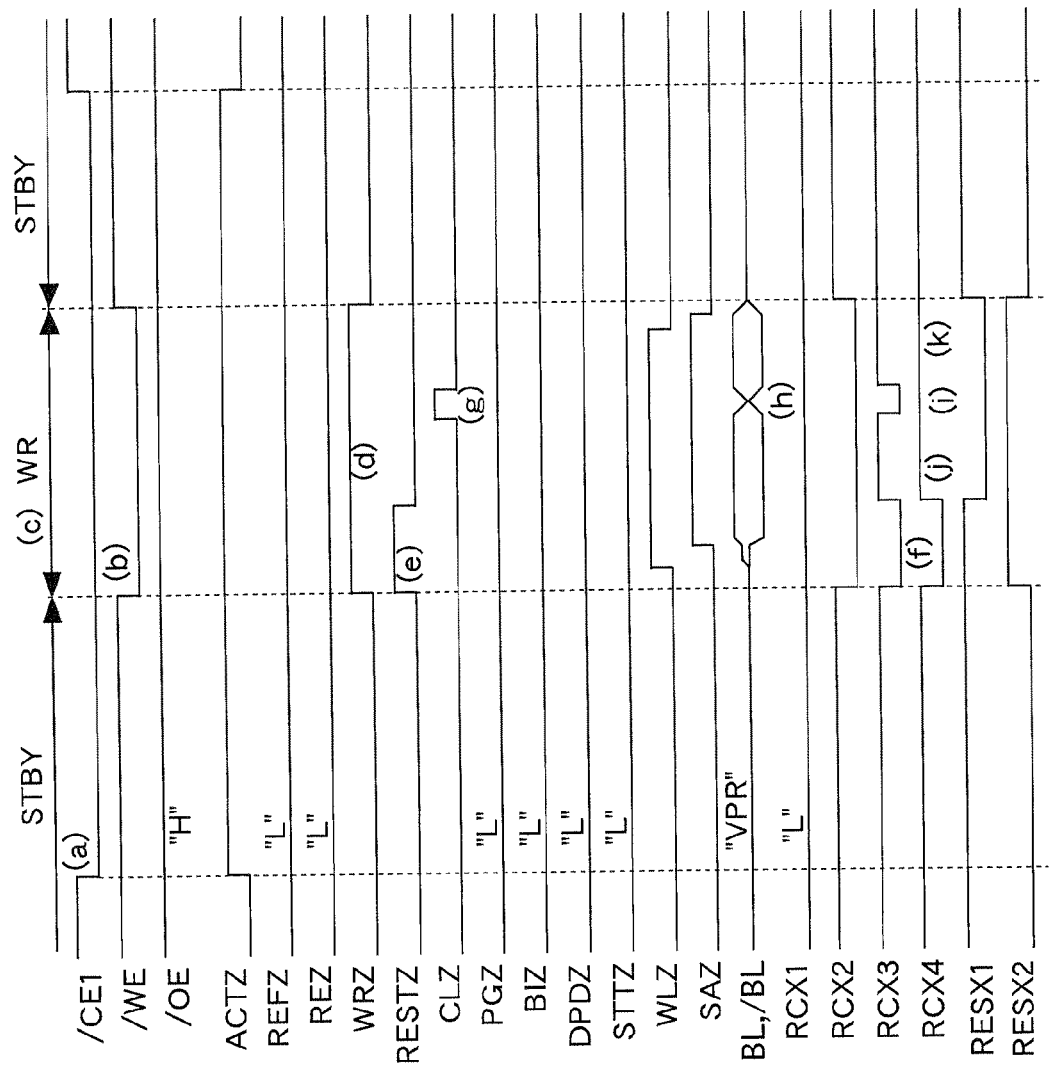
FIG. 8 is a timing chart illustrating an asynchronous write operation of the first embodiment.

FIG. 8 illustrates the asynchronous write operation WR of the first embodiment. In the asynchronous write operation WR, as in the asynchronous read operation RE, the first chip enable signal /CE1 is first activated to bring the memory MEM into an active standby state (FIG. 8(a)). Next, the memory controller MCN activates the write enable signal /WE (FIG. 8(b)). Since the page signal PGZ is inactive, the memory MEM starts the asynchronous write operation WR in synchronization with the activation of the write enable signal /WE (FIG. 8(c)).

In the asynchronous write operation WR, the write command signal WRZ is kept active during an activation period of the write enable signal /WE (FIG. 8(d)). First, the restore operation REST is executed as in the refresh operation REF illustrated in FIG. 6. During the execution of the restore operation REST, the restore signal RESTZ is active (FIG. 8(e)). Waveforms of the word activation signal WLZ, the sense amplifier activation signal SAZ, and the bit line pair BL, /BL in the restore operation REST are the same as those in the refresh operation REF. During the restore operation REST, the regulators RGL1-4 are on and the resistor control signals RESX1-2 are off (FIG. 8(f)).

Next, the column activation signal CLZ is activated to turn on the column switch CSW, so that the column operation CL is executed (FIG. 8(g)). In the column operation CL, a write data signal received at the data terminal DQ is supplied to the memory core 36. If logic of the write data signal is inverse to logic of the read data signal amplified on the bit line pair BL, /BL, the logic of the bit line pair BL, /BL is inverted (FIG. 8(h)). During the column operation CL, the regulator RGL1-3 are on and the resistor control signal RESX1 is on (FIG. 8(i)). In the asynchronous write operation WR, a period except periods of the restore operation REST and the column operation CL is a period of the ON operation SAON of the sense amplifier SA. During the ON operation SAON of the sense amplifier SA, the regulators RGL1-2 are on and the resistor control signal RESX1 is on (FIG. 8(*j*, *k*)).

FIG. 9 illustrates the synchronous read operation SRE of the first embodiment. The memory MEM activates the page signal PGZ when a page operation bit of the mode register 20 is set (FIG. 9(*a*)). In the synchronous read operation SRE as in the asynchronous read operation RE, the first chip enable signal /CE1 is first activated to bring the memory MEM into an active standby state (FIG. 9(*b*)). Next, the memory controller MCNT activates the output enable signal /OE (FIG. 9(*c*)). Since the page signal PGZ is active, the memory MEM starts the synchronous read operation SRE in synchronization with the activation of the output enable signal /OE (FIG. 9(*d*)).

In the synchronous read operation SRE, the read command signal REZ is kept active during an activation period of the output enable signal /OE (FIG. 9(*e*)). First, the restore operation REST is executed as in the refresh operation REF illustrated in FIG. 6. Waveforms in the restore operation REST are the same as those in the asynchronous write operation WR. That is, the regulators RGL1-4 are on and the resistor control signals RESX1-2 are off (FIG. 9(*f*)).

Next, the column activation signal CLZ is activated the number of times equal to the burst length (in this example, "4") set in the mode register 20 (FIG. 9(*g*)). The operation during an activation period of the column activation signal CLZ (column operation CL) is the same as that in the asynchronous read operation RE illustrated in FIG. 7. In the synchronous read operation SRE, a period except periods of the restore operation REST and the column operation CL is a period of the ON operation SAON of the sense amplifier SA. Waveforms of the regulator control signals RCX1-4 and the resistor control signals RESX1-2 in the column operation CL and the ON operation SAON of the sense amplifier SA are the same as those in the asynchronous write operation WR (FIG. 8).

Figure 10:
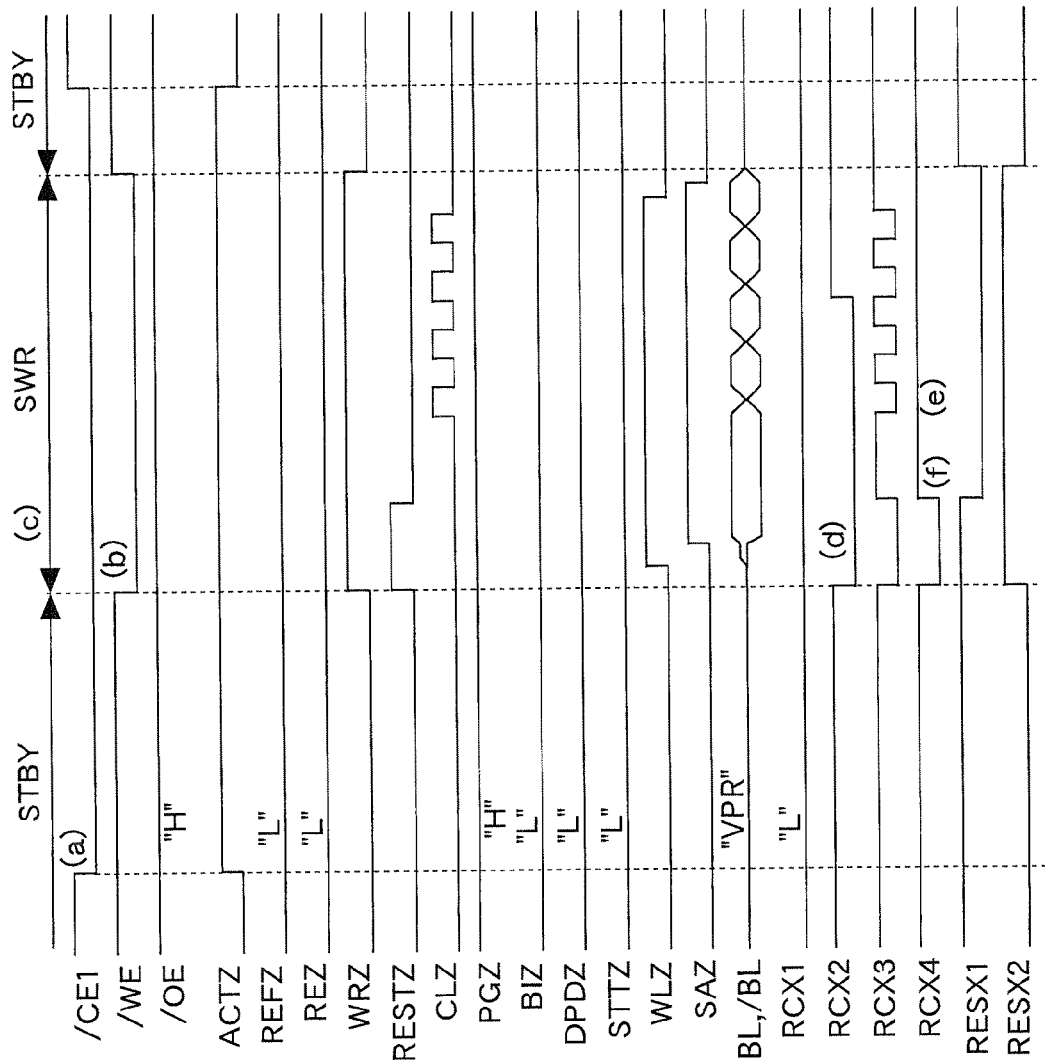
FIG. 10 is a timing chart illustrating a synchronous write operation of the first embodiment.

FIG. 10 illustrates the synchronous write operation SWR of the first embodiment. In the synchronous write operation SWR as in the asynchronous write operation WR, the first chip enable signal /CE1 is first activated to bring the memory MEM into an active standby state (FIG. 10(*a*)). Next, the memory controller MCNT activates the write enable signal /WE (FIG. 10(*b*)). Since the page signal PGZ is active, the memory MEM starts the synchronous write operation SWR in synchronization with the activation of the write enable signal /WE (FIG. 10(*c*)). The synchronous write operation SWR is the same as the asynchronous write operation WR except in that the column activation signal CLZ is activated a plurality of times and the plural column operations CL are executed. That is, during the restore operation REST during which the restore signal RESTZ is active, the regulators RGL1-4 are on and the resistor control signals RSX1-2 are off (FIG. 10(*d*)). During the column operation CL, the regulators RL1-3 are on and the resistor control signal RESX1 is on (FIG. 10(*e*)). During the ON operation SAON of the sense amplifier SA, the regulators RGL1-2 are on and the resistor control signal RESX1 is on (FIG. 10(*f*)).

Figure 11:
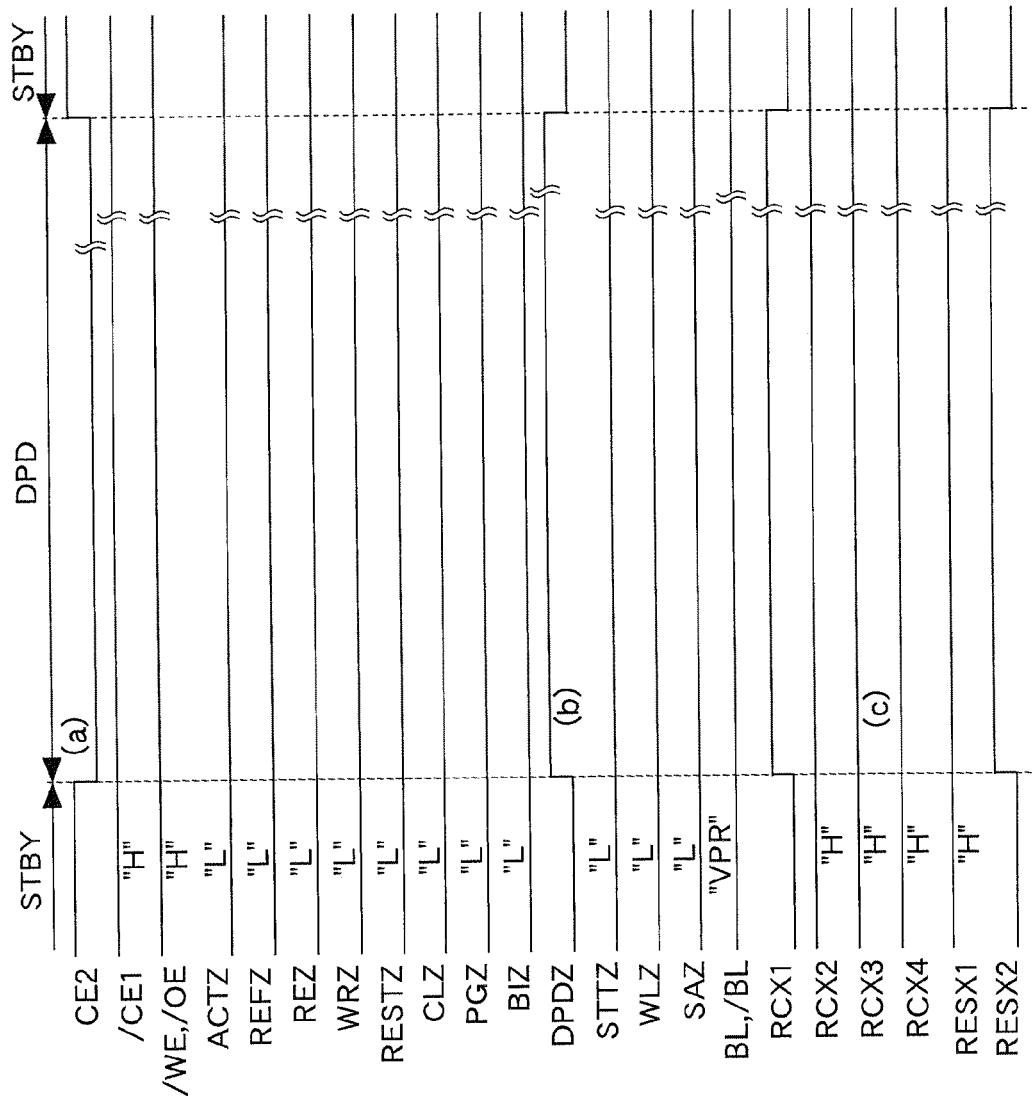
FIG. 11 is a timing chart illustrating operations in a deep power-down mode of the first embodiment.

FIG. 11 illustrates operations in the deep power-down mode DPD of the first embodiment. When logic level of the second chip enable signal CE2 turns to low, the memory MEM shifts to the deep power-down mode DPD (FIG. 11(*a*)). During the deep power-down mode DPD, the deep power-down signal DPDZ is active (FIG. 11(*b*)). Further, during the deep power-down mode DPD, the regulator control signals RCX1-4 and the resistor control signals RESX1-2 are inactive (FIG. 11(*c*)). Incidentally, during the deep power-down mode DPD, levels of the first chip enable signal /CE1, the write enable signal /WE, and the output enable signal /OE may be either high logic level H or low logic level L.

FIG. 12 illustrates the operation at the power-on time of the first embodiment. First, upon power-on of the system SYS, the external power supply voltage VDD supplied to the memory MEM gradually increases (FIG. 12(*a*)). A voltage of the starter signal STTZ increases along with the external power supply voltage VDD (FIG. 12(*b*)). That is, the starter signal STTZ is activated. When the power supply voltage VDD increases up to a predetermined voltage (for example, 3 V), the internal voltage generation circuit 24 operates to generate the internal power supply voltage VII (for example, 1.6 V) (FIG. 12(*c*)). The starter signal STTZ is inactivated in response to the generation of the internal power supply voltage VII (FIG. 12(*d*)). Due to the inactivation of the starter signal STTZ, the operation mode of the memory MEM shifts from the power-on mode PON to the standby mode STBY. Among internal circuits of the memory MEM, circuits requiring resetting are reset while the starter signal STTZ is active.

During a period in which logic level of the starter signal STTZ is high in the power-on period PON, the regulator control signals RCX1-4 are active and the resistor control signals RESX1-2 are inactive (FIG. 12(*e*)). This enables a quick increase in the internal power supply voltage VII at the power-on time.

FIG. 13 illustrates operations in the burn-in test of the first embodiment. The burn-in signal BIZ is activated when a burn-in bit of the mode register 20 is set (FIG. 13(*a*)). During the burn-in mode BI, the regulator control signal RCX1-4 are active and the resistor control signal RESX1-2 are inactive (FIG. 13(*b*)). Consequently, the internal power supply voltage VII is set equal to or higher than a predetermined voltage.

In this example, during the burn-in mode BI, the word activation signal WLZ is active and all the word lines WL are set to a boosted voltage (FIG. 13(*c*)). Further, the sense amplifier activation signal SAZ is active and all the bit line pairs BL, /BL are set to high level or low level (FIG. 13(*d*)). The level of the bit lines BL, /BL is set according to logic of a data signal written to the memory cell MC, before the entry to the burn-in mode BI. Then, the burn-in test is executed. Incidentally, during the burn-in mode BI, levels of the first chip enable signal /CE1, the write enable signal /WE, and the output enable signal /OE may be either high logic level H or low logic level L.

Figure 14:
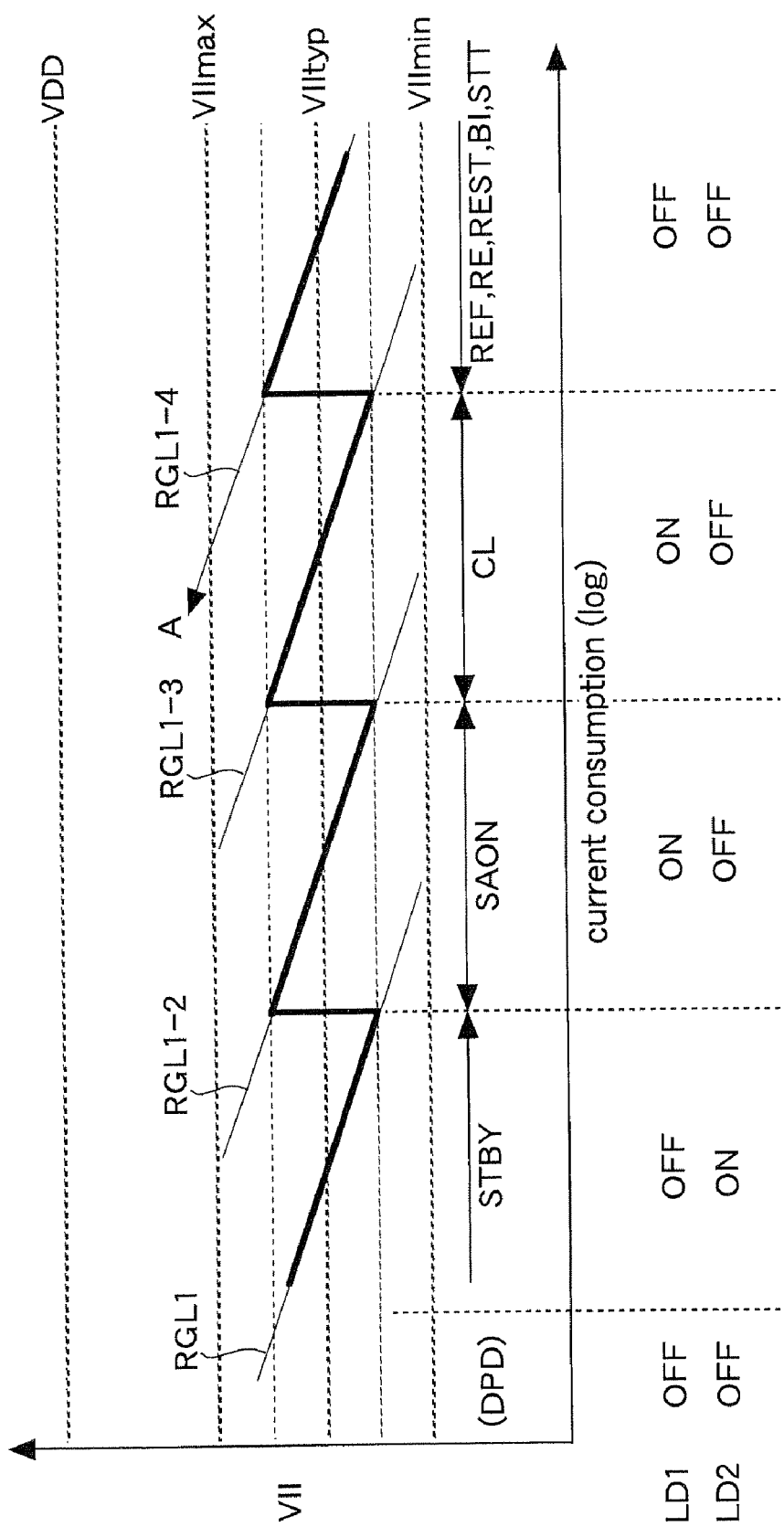
FIG. 14 is an explanatory chart illustrating operations of the internal voltage generation circuit of the first embodiment.

FIG. 14 illustrates operations of the internal voltage generation circuit 24 of the first embodiment. In this embodiment, the number of the regulators RGL1-4 supplying a current to the internal power supply line VII is changed according to a current consumption state of the internal circuits of the memory MEM. In particular, in the asynchronous write operation WR, the synchronous read operation SRE, and the synchronous write operation SWR, the operations of the regulators RGL1-4 and the load circuits LD1-2 are changed according to the sub operations included in each of the operations. This can keep the internal power supply voltage VII at around an expected level VIItyp (for example, 1.6 V).

Further, in addition to the number of the regulators RGL1-4, the number of the load circuits LD1-2 coupling the internal power supply line VII to the ground line VSS is changed according to the current consumption state of the internal circuits of the memory MEM. This can surely prevent the internal power supply voltage VII from exceeding an upper limit level VIImax in, for example, an operation state where the current consumption is relatively low. Concretely, in the ON operation SAON of the sense amplifier SA and the column operation CL, current consumed by the sense amplifier SA and so on differs depending on logic of a write data signal or a read data signal. When the memory MEM is designed, the number of the regulators RGL operating in each of the operations SAON, CL is decided according to the maximum current consumption. Therefore, if a logic pattern of a data signal is a pattern with low current consumption, the internal power supply voltage VII might exceed the upper limit level VIImax without the load circuits LD1-2. In other words, by linking the number of the operating regulators among the regulators RGL1-4 and the number of operating circuits among the load circuits LD1-2 with each other, it is possible to keep the internal power supply voltage VII at around the expected level VIItyp (for example, 1.6V). Incidentally, the pattern with low current consumption is, for example, a pattern when in the write operations WR, SWR, logic of a data signal read from the memory cell MC by the restore operation REST and logic of a write data signal are the same.

Before this embodiment was proposed, drivability of a regulator generating the internal power supply voltage VII is changed depending on a standby period and an activation period, for instance. In this case, in the write operation, for instance, current consumption of the memory core 36 temporarily decreases during a period from the completion of the restore operation REST up to the supply of write data to the bit lines BL, /BL. At this time, there was a risk that the internal power supply voltage VII may exceed the tolerable upper limit level VIImax as shown by the arrow A in FIG. 14. If the upper limit level VIImax is exceeded, a high voltage is given to the gate of the transistor and so on, resulting in deteriorated reliability of the transistor.

As described above, in the first embodiment, the number of the operating regulators RGL is changed, for example, according to the number of the operating circuit blocks or is changed according to the operation of the circuit blocks requiring high power consumption. By changing the operating regulators RGL according to the actual operation of the internal circuits, it is possible to reduce variation in the internal power supply voltage VII to a minimum. In particular, by generating the regulator control signals according to the operation control signals WLZ, SAZ, CLZ and so on, it is possible to change the number of the operating regulators RGL in the read operation and the write operation, according to the actual operations of the circuit blocks. As a result, it is possible to improve an operating margin of the memory MEM and improve a yield of the memory MEM.

By changing the number of the operating load circuits LD in addition to changing the number of the operating regulators RGL, it is possible to prevent the internal power supply voltage VII from increasing to the tolerable level or above. That is, by generating the regulator control signals RCX and the load control signals RESX according to the actual operations of the internal circuits to control the operations of the regulators RGL and the load circuits LD, it is possible to reduce variation in the internal power supply voltage VII to a minimum.

Figure 15:
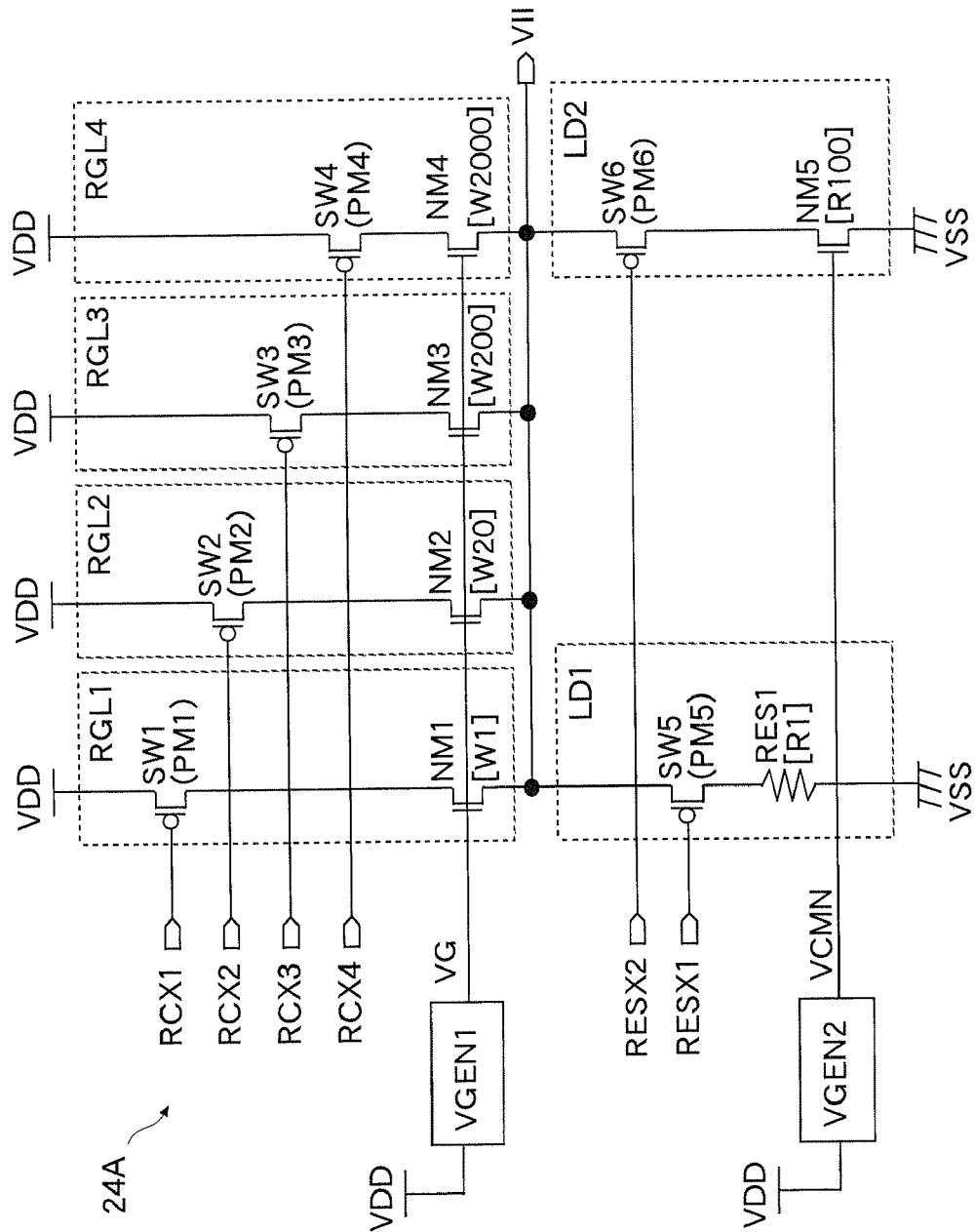
FIG. 15 is a circuit diagram illustrating an internal voltage generation circuit in a second embodiment.

FIG. 15 illustrates an internal voltage generation circuit 24A in a second embodiment. The same reference numerals and symbols are used to designate the same elements as the elements described in the first embodiment, and detailed description thereof will be omitted. Except for the internal voltage generation circuit 24A, the second embodiment is the same in the structure and operations as the first embodiment. That is, a semiconductor memory MEM is a FCRM (Fast Cycle RAM) of a clock synchronous type. A system SYS on which the memory MEM is mounted is the same as that in FIG. 5.

The internal voltage generation circuit 24A has an nMOS transistor NM5 operating as a high-resistance resistor, in place of the resistor RES2 of the internal voltage generation circuit 24 illustrated in FIG. 3. The internal voltage generation circuit 24A further has a voltage generator VGEN2. The voltage generator VGEN2 generates a constant voltage VCMN for turning on the transistor NM5, when receiving an external power supply voltage VDD. That is, in this embodiment, a load circuit LD2 includes the transistor NM5. A resistance ratio of the load circuits LD1-2 (1:100) is the same as that in the first embodiment.

Specifically, in this embodiment, the load circuit LD1 with a low resistance has a switch SW5 and a resistor element RES1 which are disposed in series between an internal power supply line VII and a ground line VSS. The load circuit LD2 with a high resistance has a switch SW6 and the transistor NM5 which are disposed in series between the internal power supply line VII and the ground line VSS.

In this embodiment, the load circuit LD1 with the low resistance includes the resistor element RES1 in which a current amount changes according to an ohmic characteristic. Therefore, when current consumption of internal circuits decreases, a current flowing through the load circuit LD1 increases in accordance with an increase in an internal power supply voltage VII. On the other hand, when current consumption of the internal circuits increases and the internal power supply voltage VII lowers, a current flowing through the load circuit LD1 decreases. This can prevent useless current consumption. Forming the load circuit LD2 with the high resistance by a resistor element would necessitate an increase in layout size in order to ensure accuracy of the resistance. The use of the transistor NM5 to form the load circuit LD2 makes it possible to reduce the layout size.

The foregoing second embodiment can provide the same effects as those of the above-described first embodiment. In addition, in this embodiment, since the high-resistance resistor element of the load circuit LD2 is formed by using the transistor NM5, it is possible to reduce the layout size of the load circuit LD2. As a result, chip size of the semiconductor memory MEM can be reduced.

Figure 16:
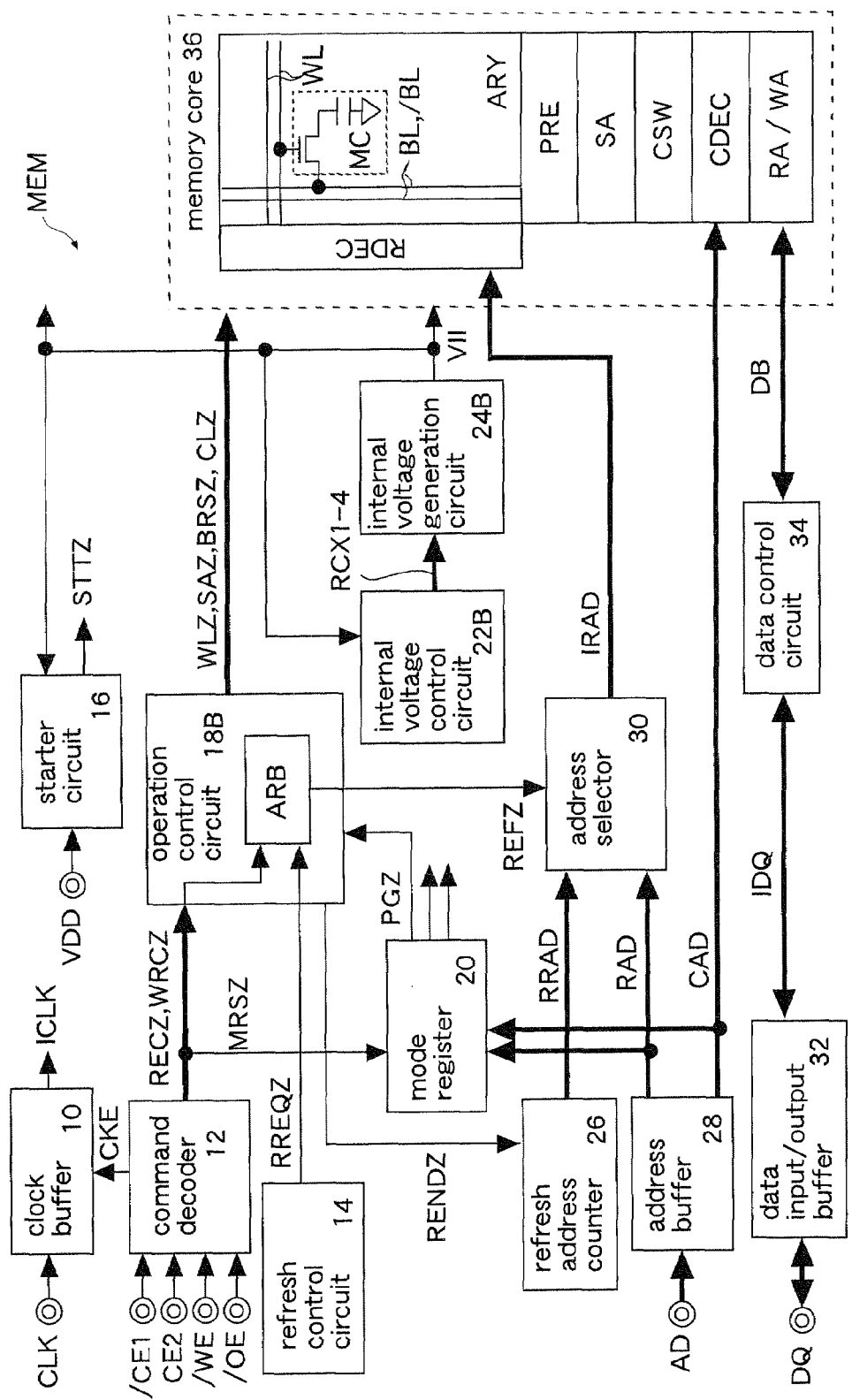
FIG. 16 is a block diagram illustrating a third embodiment.

FIG. 16 illustrates a third embodiment. The same reference numerals and symbols are used to designate the same elements as the elements described in the first embodiment, and detailed description thereof will be omitted. In this embodiment, an operation control circuit 18B, an internal voltage control circuit 22B, and an internal voltage generation circuit 24B are provided in place of the operation control circuit 18, the internal voltage control circuit 22, and the internal voltage generation circuit 24 of the first embodiment. The other structure is the same as that of the first embodiment. That is, a semiconductor memory MEM is a FCRAM (Fast Cycle RAM) of a clock synchronous type. A system SYS on which the memory MEM is mounted is the same as that in FIG. 5.

The operation control circuit 18B outputs a word activation signal WLZ, a sense amplifier activation signal SAZ, a precharge control signal BRSZ, a column activation signal CLZ, and a refresh signal REFZ in order to cause the memory core 36 to execute a read operation, a write operation, and a refresh operation in response to a read command signal REZ, a write command signal WRZ, and a refresh request RREQZ. The operation control circuit 18B is the same as the operation control circuit 18 of the first embodiment except in that it outputs neither the activation signal ACTZ nor the restore signal RESTZ.

Figure 17:
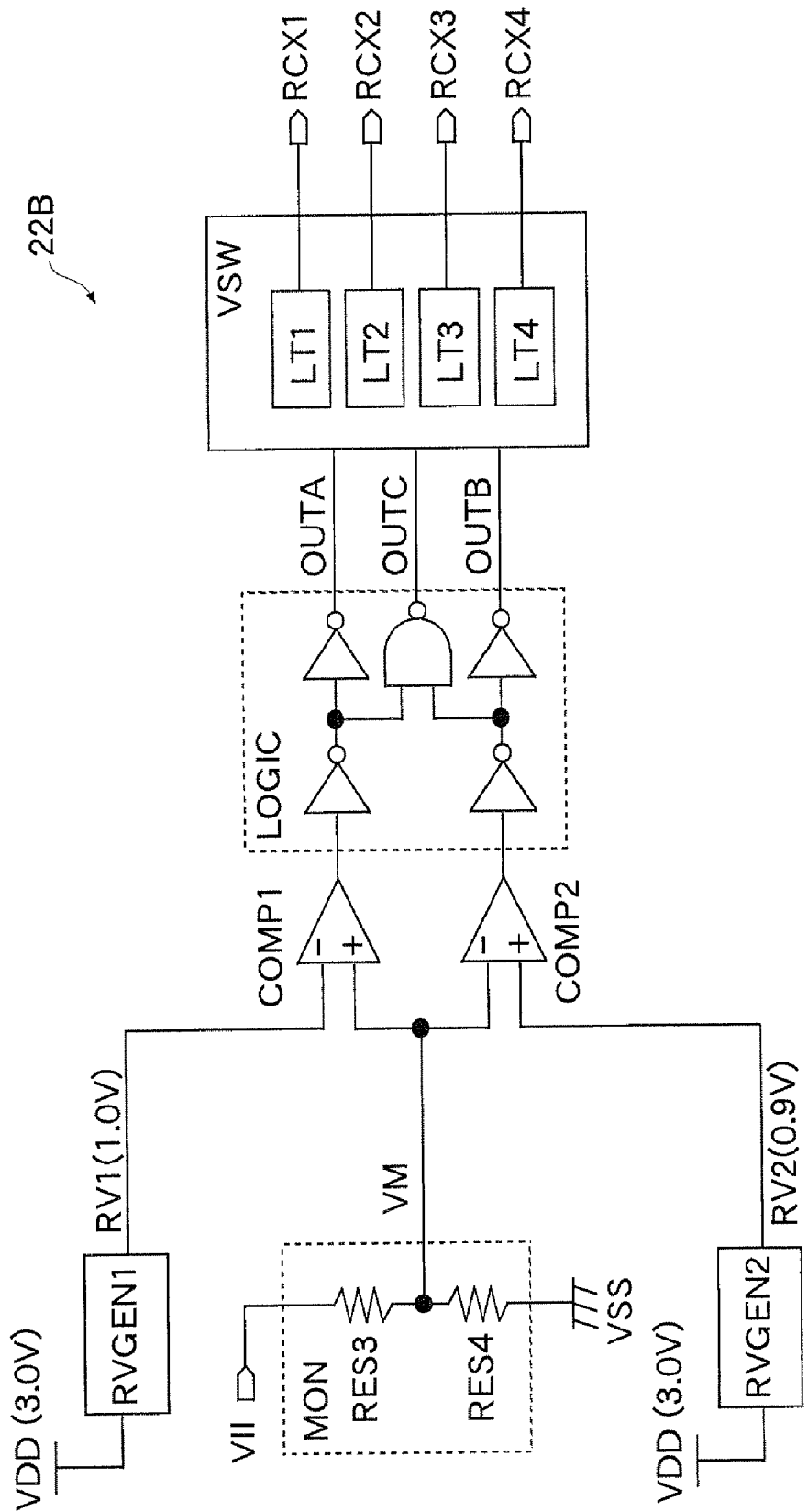
FIG. 17 is a block diagram illustrating an internal voltage control circuit illustrated in FIG. 16.
Figure 21:
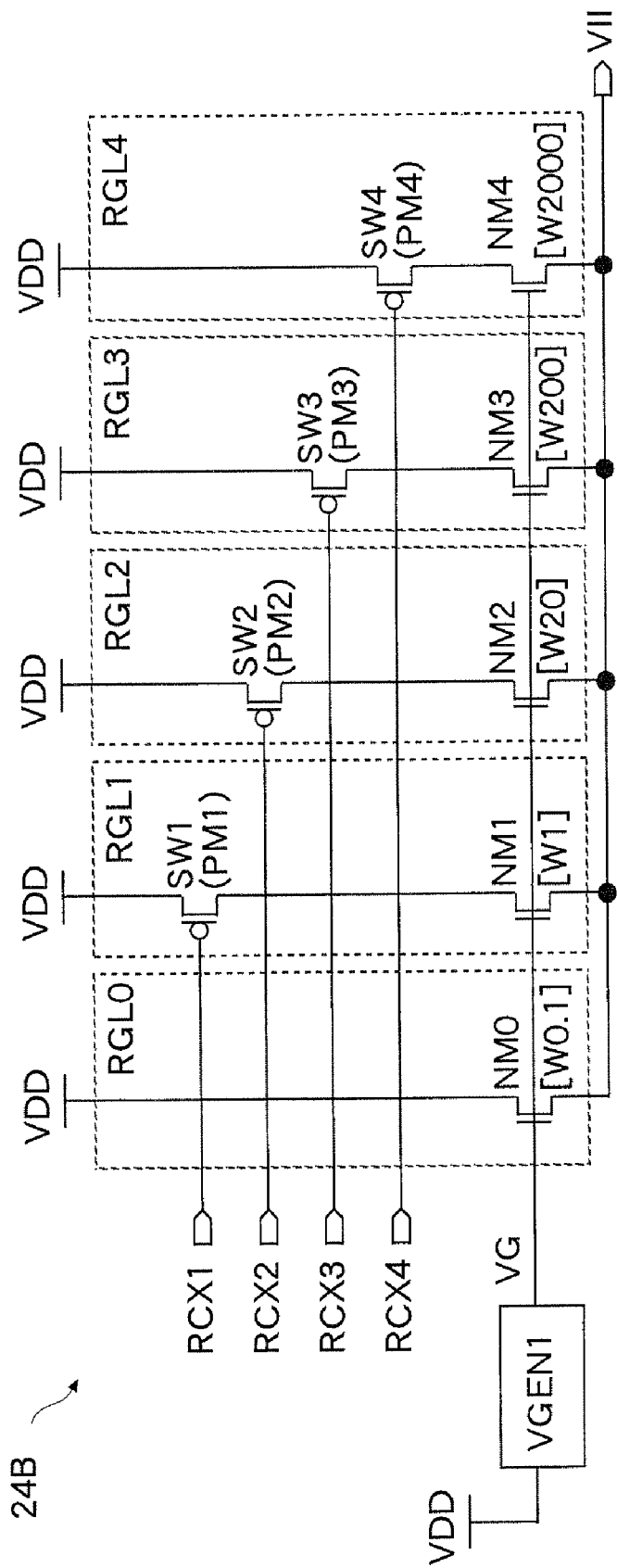
FIG. 21 is a circuit diagram illustrating an internal voltage generation circuit illustrated in FIG. 16.

The internal voltage control circuit 22B outputs regulator control signals RCX1-4 according to a level of an internal power supply voltage VII. The internal voltage control circuit 22B does not output the resistor control signals RESX1-2. Details of the internal voltage control circuit 22B are illustrated in FIG. 17. The internal voltage generation circuit 24B generates the internal power supply voltage VII according to the regulator control signals RCX1-4. Details of the internal voltage generation circuit 24B are shown in FIG. 21.

FIG. 17 shows the internal voltage control circuit 22B illustrated in FIG. 16. The internal voltage control circuit 22B has a first and a second reference voltage generation circuit RVGEN1-2, a monitor circuit MON, a first and a second comparator COMP1-2, a logic circuit LOGIC, and a voltage switch circuit VSW.

The reference voltage generation circuit RVGEN1 generates a first reference voltage RV1 (for example, 1.0 V) in response to an external power supply voltage VDD (for example, 3.0 V). The reference voltage generation circuit RVGN2 generates a second reference voltage RV2 (for example, 0.9 V) in response to the external power supply voltage VDD. The reference voltages RV1-2 are constant voltages independent of the power supply voltage VDD.

The monitor circuit MON has resistors RES3-4 disposed in series between an internal power supply line VII and a ground line VSS. The monitor circuit MON outputs a monitor voltage VM which follows the internal power supply voltage VII, from a coupling node of the resistors RES3-4. The monitor voltage VM is 0.95 V when the internal power supply voltage VII is 1.6 V (expected level). The monitor circuit MON further operates as a load circuit. Therefore, no load circuit is required in the internal voltage generation circuit 24B illustrated in FIG. 21. If the monitor circuit MON does not have a sufficient function as the load circuit, the same load circuits LD1-2 as those of the first embodiment may be added.

The monitor voltage VM is easily adjustable according to resistance of the resistors RES3-4. Therefore, for example, in a case where the reference voltage generation circuits RVGEN1-2 have already been designed, the monitor voltage VM can be easily set so as to conform to the specifications of the reference voltage generation circuits RVGEN1-2. Or, if the comparators COMP1-2 have already been designed, the monitor voltage VM can be easily set so as to conform to the specifications of the comparators COMP1-2. As a result, it is possible to shorten a design period of the internal voltage control circuit 22B.

Figure 24:
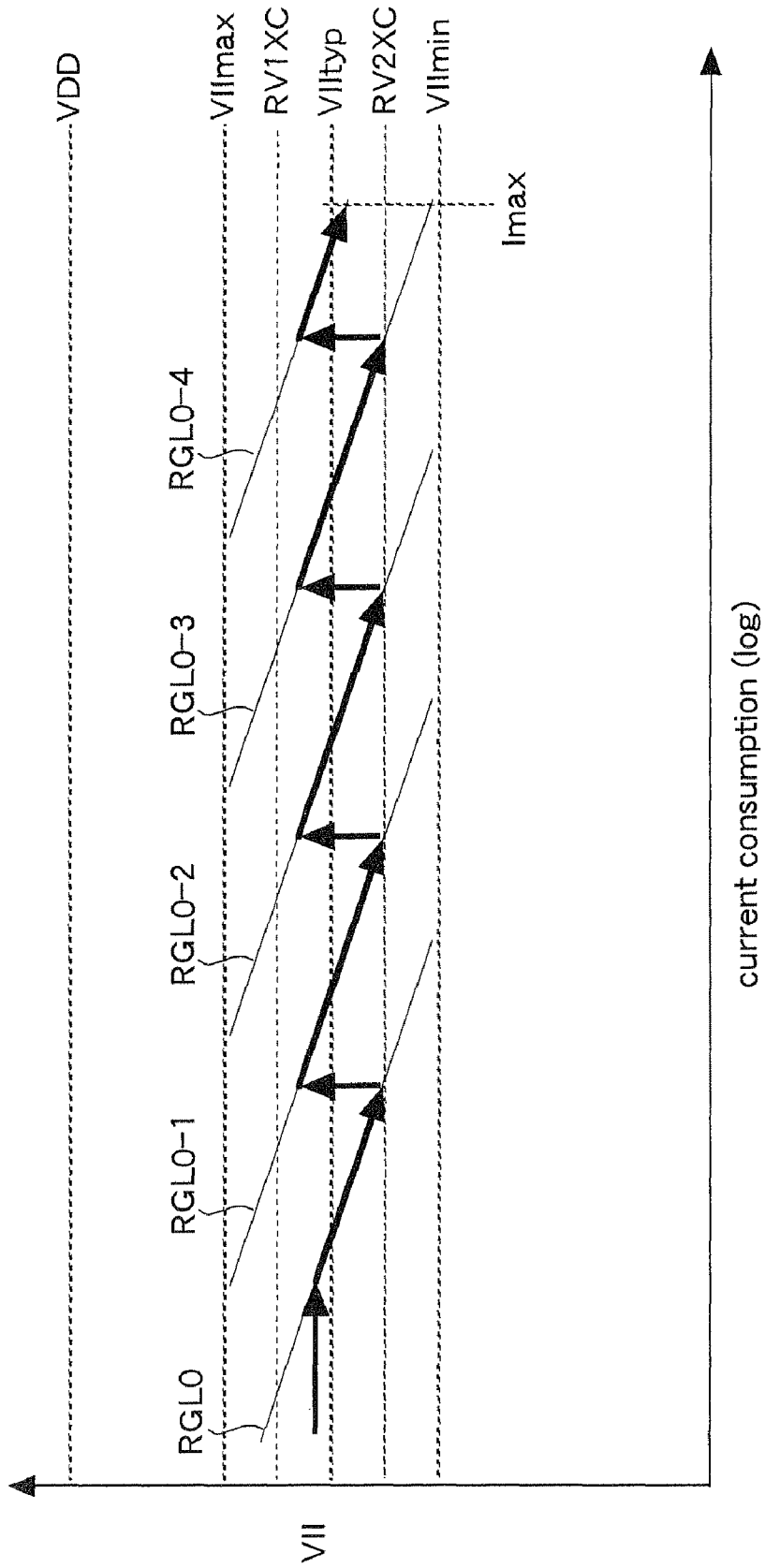
FIG. 24 is an explanatory chart illustrating an example of operations of the internal voltage generation circuit of the third embodiment.
Figure 25:
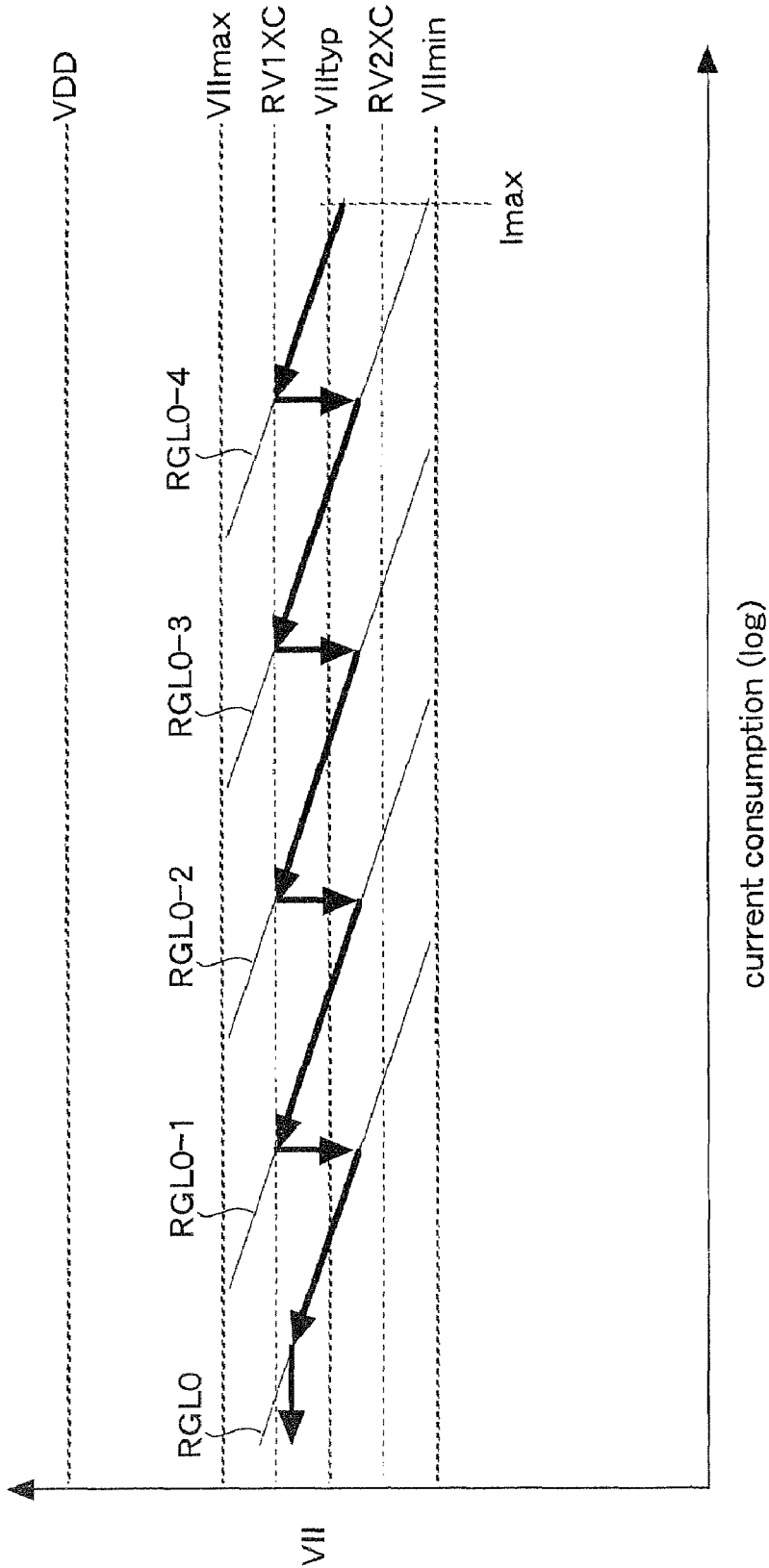
FIG. 25 is an explanatory chart illustrating an example of operations of the internal voltage generation circuit of the third embodiment.

The comparator COMP1 outputs high level when the monitor voltage VM is higher than the reference voltage RV1, and outputs low level when the monitor voltage VM is lower than the reference voltage RV1. The comparator COMP2 outputs high level when the monitor voltage VM is lower than the reference voltage RV2, and outputs low level when the monitor voltage VM is higher than the reference voltage RV2. The logic circuit LOGIC outputs signal corresponding to the output level of the comparator COMP1 as an output signal OUTA (first detection signal), and outputs signal corresponding to the output level of the comparator COMP2 as an output signal OUTB (second detection signal). In other words, the logic circuit LOGIC sets the output signal OUTA to high logic level when the monitor voltage VM is higher than the reference voltage RV1, and sets the output signal OUTB to high logic level when the monitor voltage VM is lower than the reference voltage RV2. Further, the logic circuit LOGIC outputs OR logic of the output signals OUTA, OUTB as an output signal OUTC. Actually, however, the switching of operating regulators among the regulators RGL1-4 takes place when the internal power supply voltage VII exceeds a first voltage RV1XC or when the internal power supply voltage VII becomes lower than a second voltage RV2XC, as illustrated in FIG. 24 and FIG. 25. That is, the output signal OUTA (first detection signal) is activated when the internal power supply voltage VII exceeds the first voltage RV1XC. The output signal OUTB (second detection signal) is activated when the internal power supply voltage VII is lower than the second voltage RV2XC.

The voltage switch circuit VSW has latch circuits LT1-4 generating the regulator control signals RCX1-4 respectively according to the output signals OUTA, OUTB, OUTC. Details of the latch circuits LT1-2 are illustrated in FIG. 18, and details of the latch circuits LT3-4 are illustrated in FIG. 19.

Figure 18:
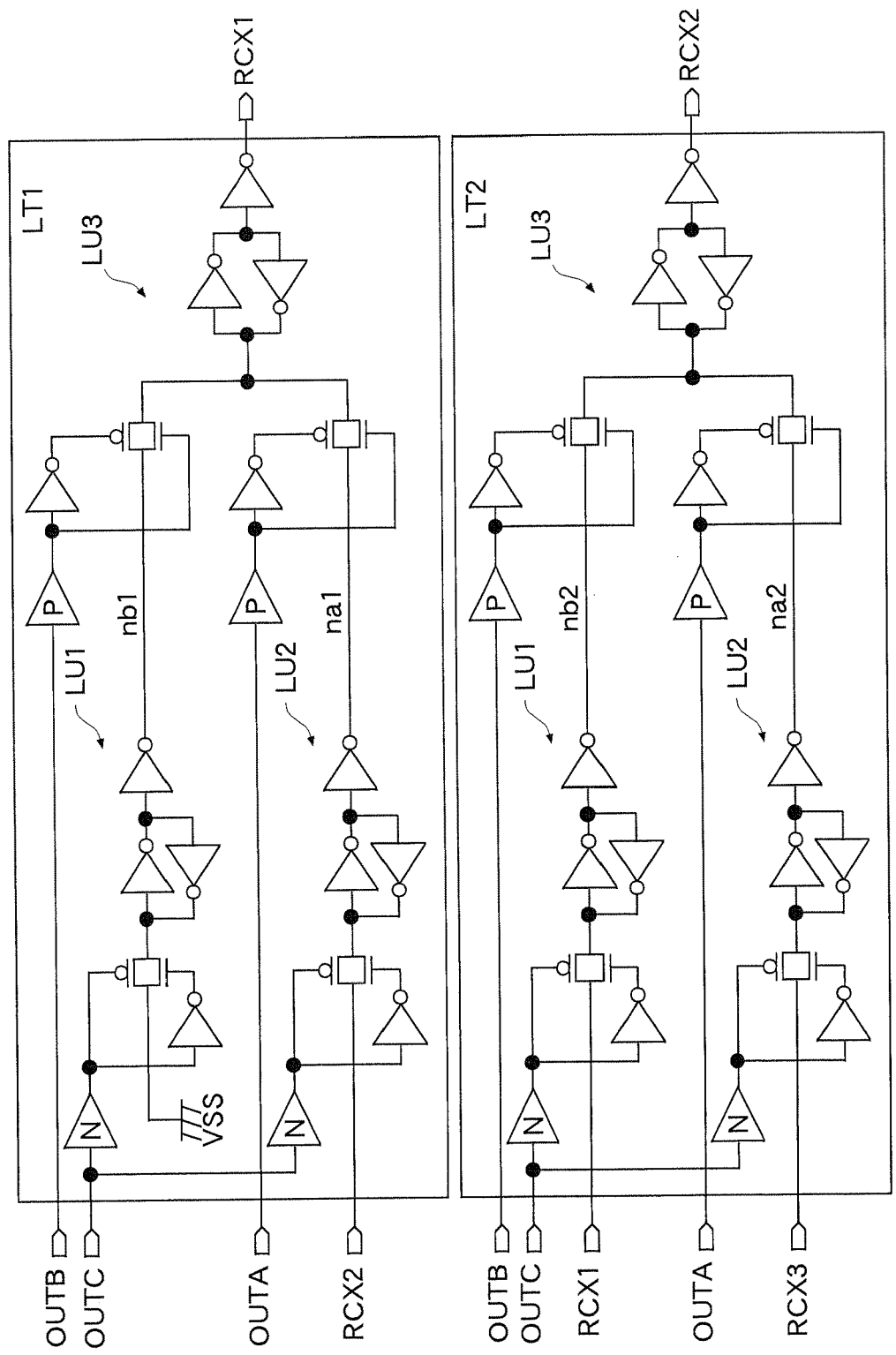
FIG. 18 is a circuit diagram illustrating latch circuits LT1-2 illustrated in FIG. 17.
Figure 19:
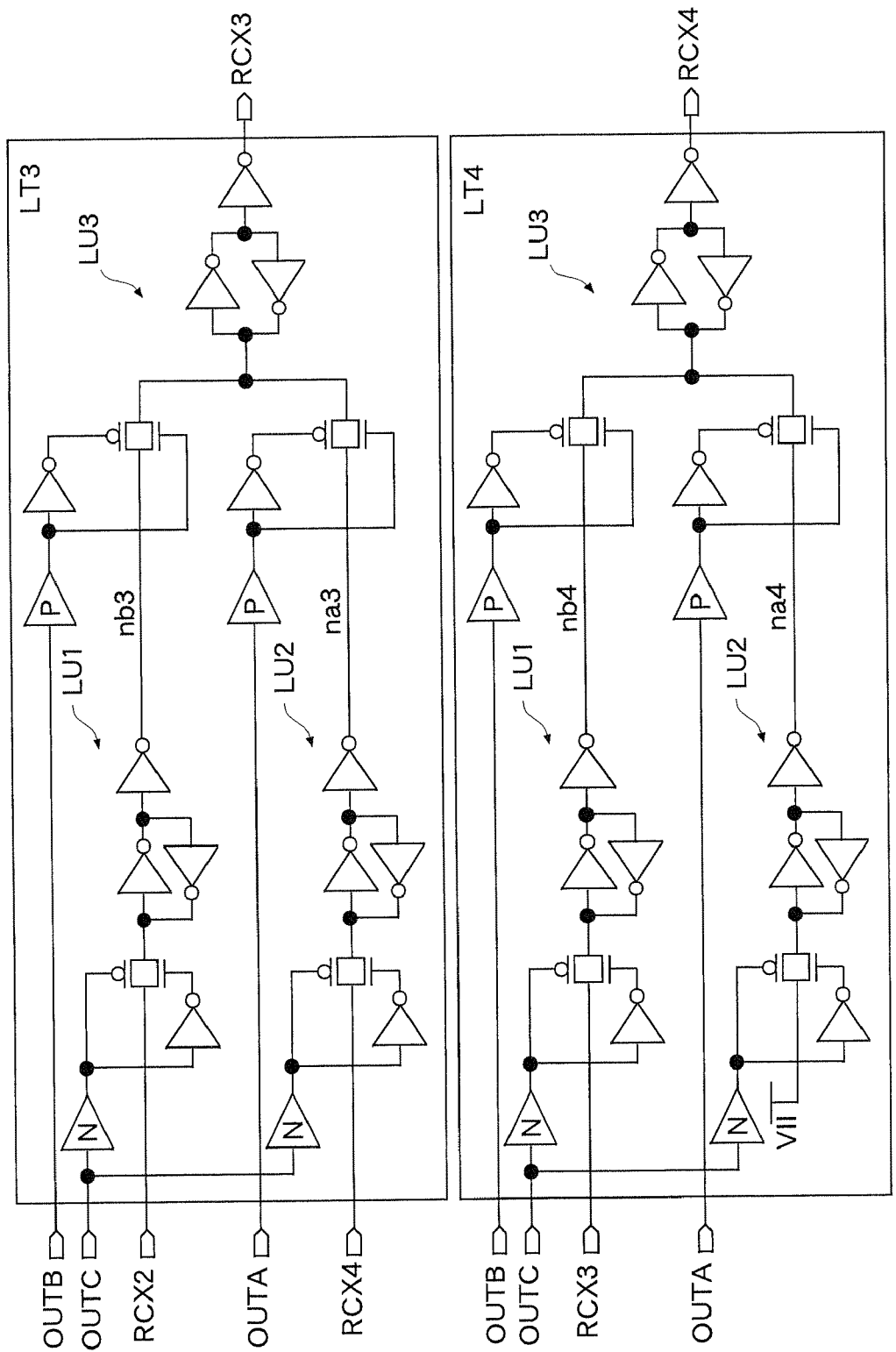
FIG. 19 is a circuit diagram illustrating latch circuits LT3-4 illustrated in FIG. 17.

FIG. 18 illustrates the latch circuits LT1-2 illustrated in FIG. 17. The latch circuit LT1 has three latch units LU1-3. The latch unit LU1 receives low logic level (VSS) in a low logic level period of the output signal OUTC, and latches the low logic level (VSS) in synchronization with a rising edge of the output signal OUTC. The output signal OUTC changes to high logic level when the monitor voltage VM is higher than the reference voltage RV1 or when the monitor voltage VM is lower than the reference voltage RV2, as described above.

Figure 20:
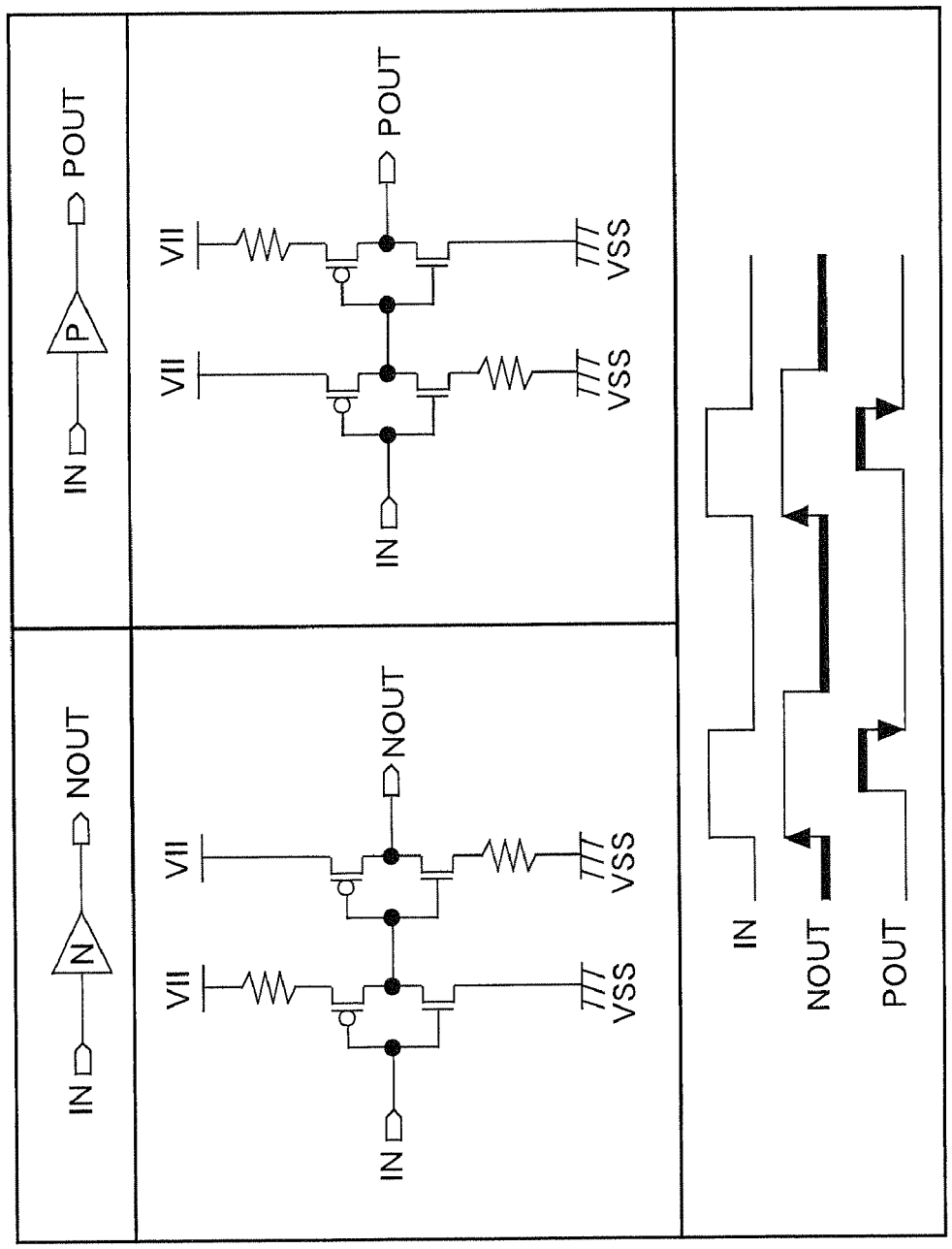
FIG. 20 is a circuit diagram illustrating buffers illustrated in FIG. 18 and FIG. 19.

The latch unit LU2 receives logic level of the regulator control signal RCX2 during the low logic level period of the output signal OUTC, and latches the logic level of the regulator control signal RCX2 in synchronization with the rising edge of the output signal OUTC. In the latch circuit LT1, the output signal OUTC is supplied to the latch units LU1, LU2 via buffers N. The output signals OUTB, OUTA are supplied to the latch unit LU3 via buffers P. Details of the buffers N, P are illustrated in FIG. 20.

The regulator RGL2 operating according to the regulator control signal RCX2 has one-level higher drivability than drivability of the regulator RGL1 operating according to the regulator control signal RCX1. In the operations of the latch circuits LT1-4, the regulator control signal RCX2, for example, relative to the regulator control signal RCX1 will be hereinafter referred to as the regulator control signal RCX2 with one-level higher drivability. Similarly, for example, the regulator control signal RCX1 relative to the regulator control signal RCX2 will be referred to as the regulator control signal RCX1 with one-level lower drivability.

During a high logic level period of the output signal OUTB, the latch unit LU3 receives logic level latched by the latch unit LU1, and latches the logic level received by the latch unit LU1, in synchronization with a falling edge of the output signal OUTB. Specifically, the latch unit LU3 receives logic level (in this case, ground level) of the regulator control signal with one-level lower drivability when the monitor voltage VM is lower than the reference voltage RV2, and latches this logic level when the monitor voltage VM becomes higher than the reference voltage RV2 to output the latched logic level as the regulator control signal RCX1.

Further, during a high logic level period of the output signal OUTA, the latch unit LU3 receives logic level latched by the latch unit LU2, and latches the logic level received by the latch unit LU2, in synchronization with a falling edge of the output signal OUTA. In other words, the latch unit LU3 receives logic level of the regulator control signal RCX2 with one-level higher drivability when the monitor voltage VM is higher than the reference voltage RV1, and when the monitor voltage VM becomes lower than the reference voltage RV1, it latches this logic level to output the logic level as the regulator control signal RCX1.

The latch circuit LT2 is the same circuit as the latch circuit LT1 except in that its input signal is different. A latch unit LU1 of the latch circuit LT2 receives logic level of the regulator control signal RCX1 with one-level lower drivability during a low logic level period of the output signal OUTC and latches the logic level of the regulator control signal RCX1 in synchronization with a rising edge of the output signal OUTC. A latch unit LU2 of the latch circuit LT2 receives logic level of the regulator control signal RCX3 with one-level higher drivability during a low logic level period of the output signal OUTC and latches the logic level of the regulator control signal RCX3 in synchronization with a rising edge of the output signal OUTC. A latch unit LU3 of the latch circuit LT2 receives logic level of the regulator control signal RCX1 with one-level lower drivability when the monitor voltage VM is lower than the reference voltage RV2, and latches this logic level when the monitor voltage VM becomes higher than the reference voltage RV2 to output it as the regulator control signal RCX2. Further, the latch unit LU3 receives logic level of the regulator control signal RCX3 with one-level higher drivability when the monitor voltage VM is higher than the reference voltage RV1, and latches this logic level when the monitor voltage VM becomes lower than the reference voltage RV1 to output it as the regulator control signal RCX2.

FIG. 19 illustrates the latch circuits LT3-4 illustrated in FIG. 17. The latch circuits LT3-4 are the same circuits as the latch circuit LT1 except in that their input signals are different. In the latch circuit LT3, when the monitor voltage VM is lower than the reference voltage RV2 or when the monitor voltage VM is higher than the reference voltage RV1, logic levels of the regulator control signals RCX2, 4 are transmitted to latch units LU1-2 respectively. Then, when the monitor voltage VM becomes higher than the reference voltage RV2, the logic level of the regulator control signal RCX2 with one-level lower drivability is output as the regulator control signal RCX3. When the monitor voltage VM becomes lower than the reference voltage RV1, the logic level of the regulator control signal RCX4 with one-level higher drivability is output as the regulator control signal RCX3.

In the latch circuit LT4, when the monitor voltage VM is lower than the reference voltage RV2 or when the monitor voltage VM is higher than the reference voltage RV1, the regulator control signal RCX3 and high logic level (VII) are transmitted to latch units LU1-2 respectively. Then, when the monitor voltage VM becomes higher than the reference voltage RV2, logic level of the regulator control signal RCX3 with one-level lower drivability is output as the regulator control signal RCX4. When the monitor voltage VM becomes lower than the reference voltage RV1, the regulator control signal RCX4 with high logic level is output.

It is possible to easily increase the number of the latch circuits LT without changing the comparators COMP1-2 or the logic circuit LOGIC. Therefore, it is possible to easily increase the total number of the regulators RGL as well. Increasing the total number of the regulators RGL enables more delicate control of the internal power supply voltage VII.

FIG. 20 illustrates the buffers N, P illustrated in FIG. 18 and FIG. 19. Each of the buffers N, P is formed by serial coupling of two CMOS inverters. In the buffer N, a source of a pMOS transistor of the initial-stage inverter is coupled to the power supply line VII via a resistor, and a source of an nMOS transistor of the post-stage inverter is coupled to the ground line VSS via a resistor. With this structure, the buffer N operates as a delay circuit delaying a falling edge of an input signal IN.

In the buffer P, a source of an nMOS transistor of the initial-stage inverter is coupled to the ground line VSS via a resistor, and a source of a pMOS transistor of the post-stage inverter is coupled to the power supply line VII via a resistor. With this structure, the buffer P operates as a delay circuit delaying a rising edge of an input signal IN.

In each of the above-described latch circuits LT1-4, a switch (CMOS transmission gate) receiving an output of the buffer N receives the input signal RCX during a low logic level period of an output signal NOUT as shown by the heavy lines in the waveform. A switch (CMOS transmission gate) receiving an output of the buffer P receives an input signal (outputs of the latch units LU1-2) during a high logic level period of an output signal POUT. Since ON periods of the switches do not coincide with each other, the input signals (RCX2 and so on) of the latch circuits LT1-4 are prevented from being directly output as the output signals (RCX1 and so on). That is, racing of the signals is prevented, which prevents malfunctions of the latch circuits LT1-4. Note that the arrows in the waveforms indicate latch timings.

FIG. 21 illustrates the internal voltage generation circuit 24B illustrated in FIG. 16. Detailed description of the same elements as those in FIG. 3 described above will be omitted. The internal voltage generation circuit 24B is structured such that in the internal voltage generation circuit 24 of the first embodiment, the switches SW5-6 and the load circuits LD1-2 are deleted and a regulator RGL0 is added.

The regulator RGL0 includes an nMOS transistor NM0. The transistor NM0 has a gate coupled to a constant voltage line VG, a source coupled to the internal power supply line VII, and a drain coupled to an external power supply line VDD. A ratio of a gate width of the transistor NM0 is 0.1 times as large as that of the transistor NM1. Having no switch, the regulator RGL0 constantly operates to supply a current to the internal power supply line VII. Therefore, in a power-on period, for instance, the internal power supply voltage VII can be generated before the voltage switch circuit VSW operates. Since the generation of the monitor voltage VM follows the generation of the internal power supply voltage VII, operation states of the comparators COMP1-2 and the voltage switch circuit VSW at the power-on time are quickly stabilized. Channel lengths of the transistors NM0-4 are equal to each other. That is, the regulators RGL0-4 are different in supply capability for supplying a current to the internal power supply line VII to which the internal power supply voltage VII is supplied.

Figure 22:
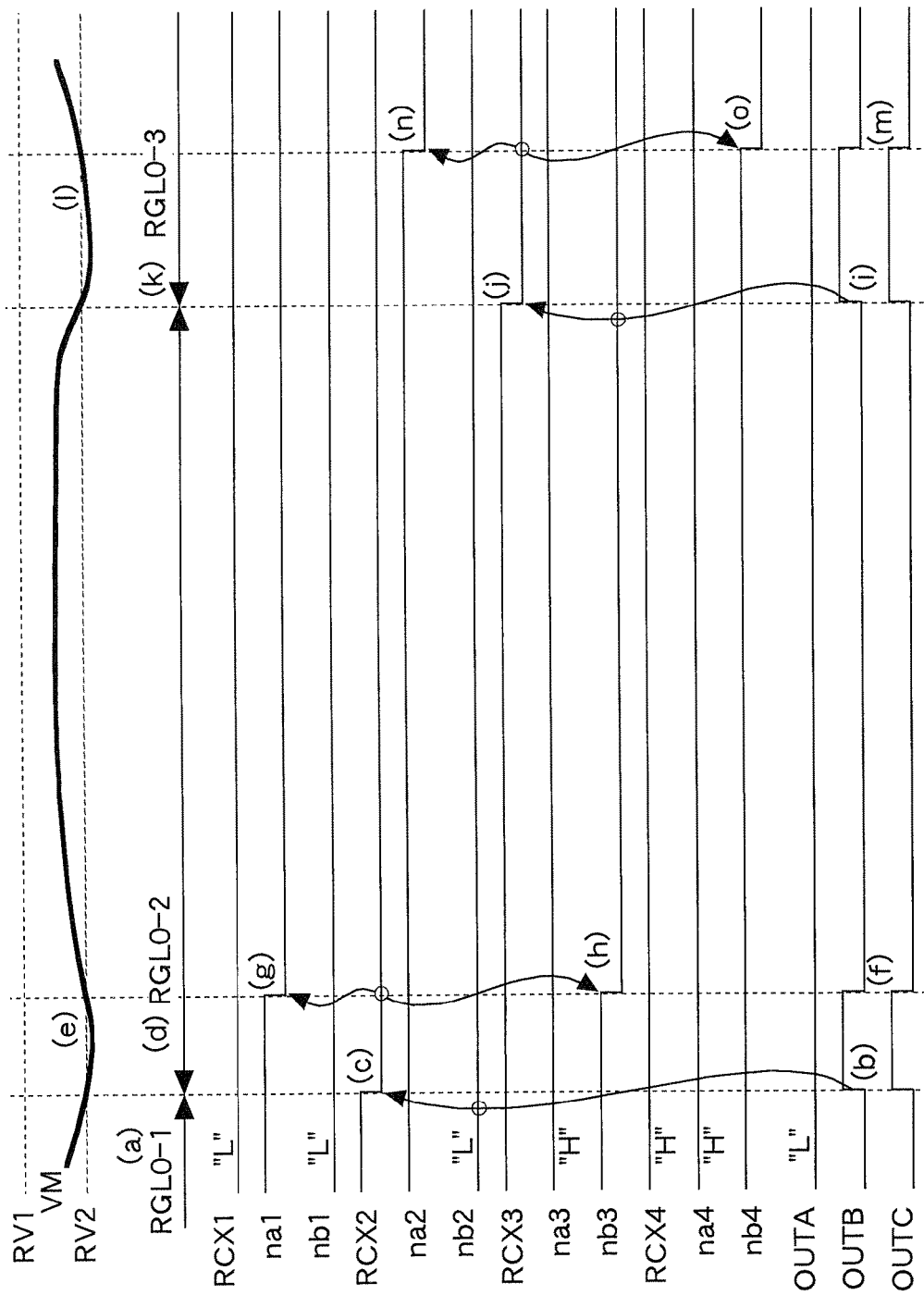
FIG. 22 is a timing chart illustrating an example of operations of the internal voltage control circuit of the third embodiment.

FIG. 22 illustrates an example of operations of the internal voltage control circuit 22B of the third embodiment. In this example, the monitor voltage VM varies at around the reference voltage RV2 (0.9 V). In an initial state, the regulators RGL0-1 are on (FIG. 22(a)). Therefore, logic levels of the regulator control signals RCX1-4 are L, H, H, and H respectively. Nodes na (na1-3) of the latch circuits LT1-3 have logic levels of the regulator control signals RCX2-4 with one-level higher drivability respectively. Nodes nb (nb2-4) of the latch circuits LT2-4 have logic levels of the regulator control signals RCX1-3 with one-level lower drivability.

When the internal power supply voltage VII decreases due to an increase in current consumption of the internal circuits such as the memory core 36 and the monitor voltage VM becomes lower than the reference voltage RV2, the output signals OUTB, OUTC change to high logic level (FIG. 22(b)). The regulator control signal RCX2 is activated in synchronization with a rising edge of the output signal OUTB (FIG. 22(c)). Consequently, the regulators RGL0-2 turn on (FIG. 22(d)). The supply capability for supplying a current to the internal power supply line VII by the internal voltage generation circuit 24B increases, so that the monitor voltage VM (internal power supply voltage VII) exhibits an increase instead of the decrease (FIG. 22(e)).

When the monitor voltage VM becomes higher than the reference voltage RV2, the output signals OUTB, OUTC change to low logic level (FIG. 22(f)). Logic level of the regulator control signal RCX2 is transmitted to the nodes na1, nb3 in synchronization with a falling edge of the output signal OUTC (FIG. 22(g, h)).

When the monitor voltage VM becomes lower than the reference voltage RV2 again due to a further increase in current consumption of the internal circuits such as the memory core 36, the output signals OUTB, OUTC change to high logic level (FIG. 22(i)). The regulator control signal RCX3 is activated in synchronization with a rising edge of the output signal OUTB (FIG. 22(j)). Consequently, the regulators RGL0-3 turn on (FIG. 22(k)). The supply capability for supplying a current to the internal power supply line VII by the internal voltage generation circuit 24B increases, so that the monitor voltage VM (internal power supply voltage VII) exhibits an increase instead of the decrease (FIG. 22(l)).

When the monitor voltage VM becomes higher than the reference voltage RV2, the output signals OUTB, OUTC change to low logic level (FIG. 22(m)). Logic level of the regulator control signal RCX3 is transmitted to the nodes na2, nb4 in synchronization with a falling edge of the output signal OUTC (FIG. 22(n, o)).

In this manner, every time the monitor voltage VM changes to become lower than the reference voltage RV2 and the output signal OUTB is activated, the number of the operating regulators RGL increases by one. In more detail, every time the output signal OUTB is activated, the regulator control signal (for example, RCX2 or RCX3) corresponding to the regulator with the lowest supply capability (for example, RGL2 or RGL3) among the inactive regulator control signals (for example, RCX2-4 or RCX3-4) is sequentially activated. In other words, the number of the operating regulators RGL is changed not according to the level of the internal power supply voltage VII but according to an increase/decrease in current consumption of the internal circuits.

Figure 23:
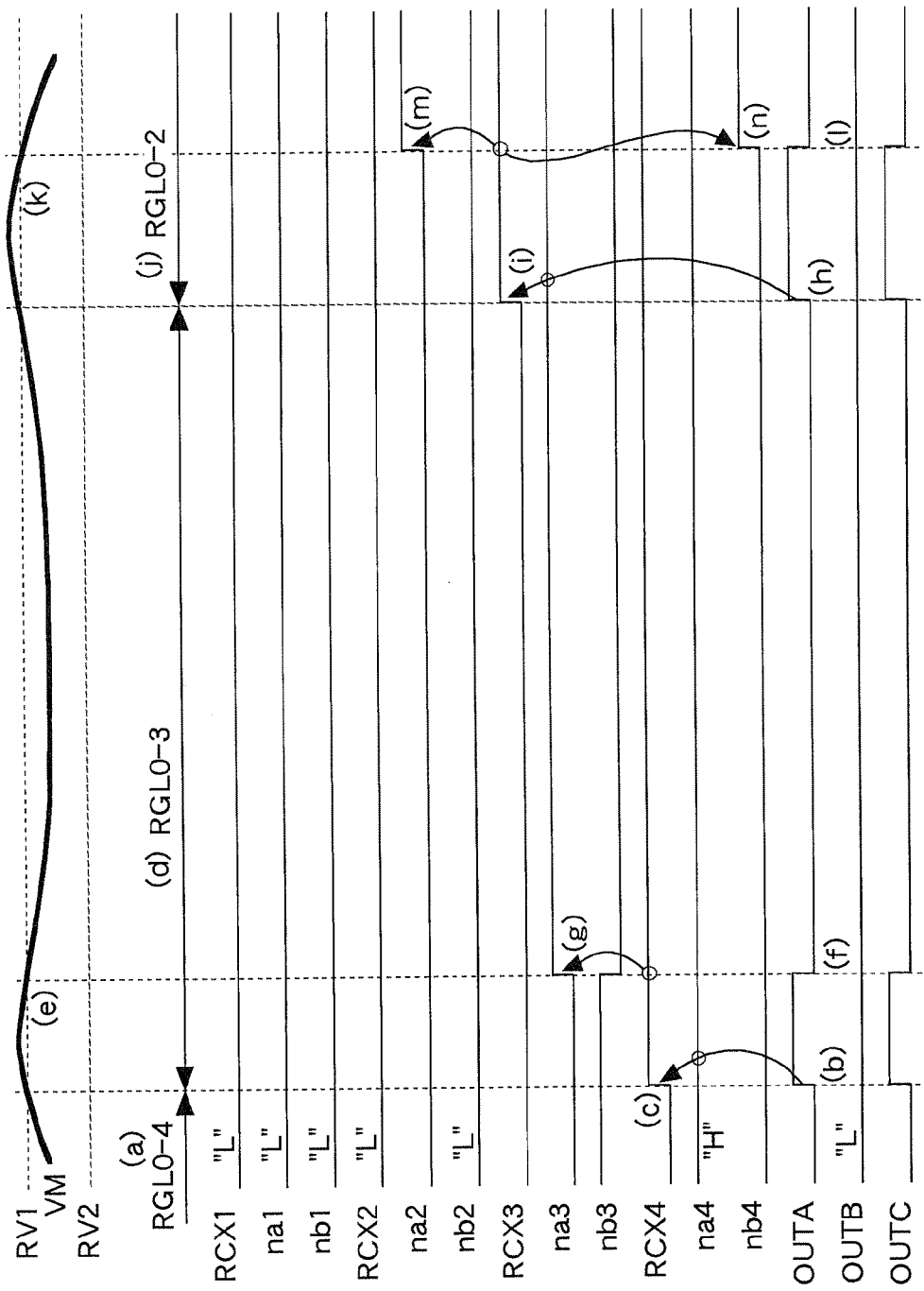
FIG. 23 is a timing chart illustrating another example of operations of the internal voltage control circuit of the third embodiment.

FIG. 23 illustrates another example of operations of the internal voltage control circuit 22B of the third embodiment. Detailed description of the same operations as those in FIG. 22 will be omitted. In this example, the monitor voltage VM changes at around the reference voltage RV1 (0.1 V). In an initial state, the regulators RGL0-4 are on (FIG. 23(a)). Therefore, logic levels of the regulator control signals RCX1-4 are all L.

When the internal power supply voltage VII increases due to a decrease in current consumption of the internal circuits such as the memory core 36 and the monitor voltage VM becomes higher than the reference voltage RV1, the output signals OUTA, OUTC change to high logic level (FIG. 23(b)). The regulator control signal RCX4 is inactivated in synchronization with a rising edge of the output signal OUTA (FIG. 23(c)). Consequently, the regulator RGL4 turns off (FIG. 23(d)). The supply capability for supplying a current to the internal power supply line VII by the internal voltage generation circuit 24B lowers, so that the monitor voltage VM (internal power supply voltage VII) exhibits a decrease instead of the increase (FIG. 23(e)).

When the monitor voltage VM becomes lower than the reference voltage RV1, the output signals OUTA, OUTC change to low logic level (FIG. 23(f)). Logic level of the regulator control signal RCX4 is transmitted to the node na3 in synchronization with a falling edge of the output signal OUTC (FIG. 23(g)).

When the monitor voltage VM becomes higher than the reference voltage RV1 again due to a further decrease in current consumption of the internal circuits such as the memory core 36, the output signals OUTA, OUTC change to high logic level (FIG. 23(h)). The regulator control signal RCX3 is inactivated in synchronization with a rising edge of the output signal OUTA (FIG. 23(i)). Consequently, the regulator RGL3 turns off (FIG. 23(j)). The supply capability for supplying a current to the internal power supply line VII by the internal voltage generation circuit 24B lowers, so that the monitor voltage VM (internal power supply voltage VII) exhibits a decrease instead of the increase (FIG. 23(k)).

When the monitor voltage VM becomes lower than the reference voltage RV1, the output signals OUTA, OUTC change to low logic level (FIG. 23(l)). Logic level of the regulator control signal RCX3 is transmitted to the nodes na2, nb4 in synchronization with a falling edge of the output signal OUTC (FIG. 23(m, n)).

In this manner, every time the monitor voltage VM changes to become higher than the reference voltage RV1 and the output signal OUTA is activated, the number of the operating regulators RGL decreases by one. In more detail, every time the output signal OUTA is activated, the regulator control signal (for example, RCX4 or RCX3) corresponding to the regulator (for example, RGL4 or RGL3) with the highest current supply capability among the active regulator control signals (for example, RCX1-4 or RCX1-3) is inactivated in sequence. In other words, the number of the operating regulators RGL is changed not according to the level of the internal power supply voltage VII but according to an increase/decrease in current consumption of the internal circuits.

In FIG. 22 and FIG. 23, the examples where the monitor voltage VM crosses only one of the reference voltages RV1-2 is described for easier understanding. Actually, however, the monitor voltage VM sometimes crosses one reference voltage (RV1 or RV2) after crossing another reference voltage. In this case, the combination of the operations in FIG. 22 and FIG. 23 takes place.

FIG. 24 and FIG. 25 illustrate examples of operations of the internal voltage generation circuit 24B of the third embodiment. In this embodiment as in the first embodiment, the number of the regulators, among the regulators RGL0-4, supplying a current to the internal power supply line VII changes according to the current consumption state of the internal circuits of the memory MEM. In particular, by referring to the monitor voltage VM which changes with the internal power supply voltage VII, it is possible to change the number of the regulators, among the regulators RGL0-4, which turn on according to a change in actual current consumption. As a result, the internal power supply voltage VII can be kept at around the expected level VIItyp (for example, 1.6 V). Further, by continuously changing the operations of the regulators RGL0-4, it is possible to keep the internal power supply voltage VII between an upper limit level and a lower limit level within a range of current consumption required by the memory MEM.

Level of RV1xC (first voltage) and RV2xC (second voltage) in FIGS. 24 and 25 are equal to the reference voltages RV1 (1.0 V), RV2 (0.9 V) multiplied by a constant C respectively. For example, the constant C is 1.68 which is equal to the expected level (1.6V) of the internal power supply voltage VII divided by the expected level (0.95) of the monitor voltage VM. At this time, the first voltage RV1xC is 1.68 V and the second voltage RV2xC is 1.52 V. That is, in this embodiment, the internal power supply voltage VII can be kept within a range from about 1.52V to about 1.68 V.

The foregoing third embodiment can provide the same effects as those of the above-described first embodiment. In addition, in this embodiment, the internal voltage control circuit 22B increases the number of the operating regulators RGL by one every time the monitor voltage VM following the internal power supply voltage VII becomes lower than the reference voltage RV2, and decreases the number of the operating regulators RGL by one every time the monitor voltage VM becomes higher than the reference voltage RV1. In more detail, the internal voltage control circuit 22B sequentially starts the operation of the regulator with the lowest supply capability among the operating regulators RGL every time the monitor voltage VM becomes lower than the reference voltage RV2. Further, the internal voltage control circuit 22B sequentially stops the operation of the regulator RGL with the highest supply capability among the operating regulators RGL every time the monitor voltage VM becomes higher than the reference voltage RV1. Consequently, it is possible to change the number of the regulators RGL supplying a current to the internal power supply line VII, not according to the level of the internal power supply voltage VII but according to a change in actual current consumption of the internal circuits. As a result, it is possible to reduce variation in the internal power supply voltage VII to a minimum and improve an operating margin of the memory MEM.

The above embodiments describe the examples where they are applied to the FCRAM. However, it should be noted that the embodiments may be applied to other semiconductor memories such as, for example, a DRAM, a SRAM or a ferroelectric memory or to a logic LSI having an internal voltage generation circuit generating an internal power supply voltage. Here, if the first embodiment is applied to a DRAM, a refresh operation is executed in response to an external refresh request signal supplied to an external terminal (command terminal) of the DRAM. In this case, the operations of the regulators RGL are the same as those in the refresh operation REF in FIG. 6.

The above third embodiment describes the example where the number of the regulators which are turned on, among the regulators RGL1-4, is adjusted according to the change in the internal power supply voltage VII. However, if, for example, an operation causing an increase in current consumption is known in advance, a predetermined one of the regulators RGL1-4 may be forcibly turned on by using a control signal indicating this operation. Here, the operations causing an increase in current consumption are, for example, the restore operation REST, the column operation CL, and so on of the first embodiment. Concretely, for example, OR logic (negative logic) of the regulator control signals RCX1-4 illustrated in FIG. 2 and the regulator control signals RCX1-4 illustrated in FIG. 17 is supplied to an input terminal of the internal voltage generation circuit 24B illustrated in FIG. 21. Consequently, it is possible to control ON/OFF of the regulators RGL1-4 in anticipation of a change in the internal power supply voltage VII. Therefore, the frequency with which the monitor voltage VM becomes higher than the reference voltage RV1 and the frequency with which the monitor voltage VM becomes lower than the reference voltage RV2 can be lowered. That is, it is possible to reduce variation in the internal power supply voltage VII and improve an operating margin of the memory MEM.

Further, an external terminal (test terminal) dedicated for receiving a control signal (test signal) for directly controlling ON/OFF of the regulators RGL may be provided in the memory MEM. The control by this test signal is given priority over the control of the regulators RGL by the regulator control signals RCX1-4. For example, the test signal is used to turn on all the regulators RGL in the burn-in test of the memory MEM. The test terminal may be provided in the memories MEM of the first and second embodiments.

The foregoing third embodiment describes the example where the number of the operating regulators RGL is increased/decreased by one every time the monitor voltage VM becomes lower than the reference voltage RV2 or every time the monitor voltage VM becomes higher than the reference voltage RV1. However, the number of the operating regulators RGL may be changed by two or more, for instance, each time.

The foregoing third embodiment describes the example where the regulator control signals RCX1-4 are generated by using the voltage switch circuit VSW formed by the latch circuits LT1-4. However, a shift resistor may be provided in place of the voltage switch circuit VSW, for instance.

A proposition of the embodiments is to suppress variation which occurs in the internal power supply voltage due to the operations of the internal circuits, thereby improving an operating margin of the semiconductor integrated circuit.

In an embodiment, an internal circuit has a plurality of circuit blocks operating by receiving an internal power supply voltage. An internal voltage control circuit generates a plurality of regulator control signals according to a combination of operating circuit blocks among the plural circuit blocks. An internal voltage generation circuit has a plurality of regulators which operate in response to activation of the respective regulator control signals to generate the internal power supply voltage by using an external power supply voltage. In this embodiment, for example, as the number of the operating circuit blocks increases, the number of the operating regulators increases. Alternatively, when a circuit block requiring high power consumption operates, the number of the operating regulators increases. In this manner, by generating the regulator control signals according to the actual operation of the internal circuit to control the operations of the regulators, it is possible to reduce variation in the internal power supply voltage to a minimum. As a result, an operating margin of the semiconductor integrated circuit can be improved and a yield of the semiconductor integrated circuit can be improved.

In another embodiment, the internal voltage generation circuit includes a plurality of load circuits. The load circuits couple an internal power supply line supplied with the internal power supply voltage to a ground line, in response to activation of a plurality of load control signals respectively. The internal voltage control circuit generates the regulator control signals and the load control signals according to the combination of the operating circuit blocks. The load circuits can prevent the internal power supply voltage from becoming equal to or higher than a tolerable level. In this case, the operations of the load circuits are controlled according to the combination of the operating circuit blocks. By thus generating the regulator control signals and the load control signals according to the actual operations of the circuits to control the operations of the regulators and the load circuits, it is possible to reduce variation in the internal power supply voltage to a minimum.

For example, the load control signals are generated by using the regulator control signals. This can reduce logic scale of the internal voltage control circuit, resulting in reduced chip size of the semiconductor integrated circuit. For example, a load circuit with a high resistance among the load circuits has a switch and a transistor which are disposed in series between an internal power supply line and a ground line. A gate of the transistor receives a voltage for tuning on the transistor. Since a high-resistance element is formed by using the transistor, layout size of the load circuit can be reduced.

In another embodiment, the semiconductor integrated circuit includes: a memory cell array. The memory cell array has a plurality of memory cells, and a plurality of word lines and a plurality of bit lines coupled to the memory cells. A command decoder receives an access request for accessing the memory cell. The internal voltage control circuit generates the regulator control signals according to the access request. For example, a controller mounted together with the semiconductor integrated circuit on a system outputs the access request. By generating the regulator control signals according to the access request, it is possible to change the operating regulator according to an actual circuit operation. As a result, variation in the internal power supply voltage can be reduced to a minimum and an operating margin of the semiconductor integrated circuit can be improved.

In another embodiment, a refresh control circuit periodically generates a refresh request for refreshing the memory cells. The internal voltage control circuit generates the regulator control signals in response to the refresh request. By generating the regulator control signals according to the refresh request generated internally in the semiconductor integrated circuit, it is possible to change the operations of the operating regulators according to an actual circuit operation. As a result, variation in the internal power supply voltage can be reduced to a minimum and an operating margin of the semiconductor integrated circuit can be improved.

In another embodiment, an operation control circuit generates a plurality of kinds of operation control signals controlling operations of the circuit blocks respectively, according to the access request. The internal voltage control circuit generates the regulator control signals in response to at least one of the operation control signals. For example, the internal circuit has, as the circuit blocks, a row decoder, a sense amplifier, and a column switch. The row decoder selects one of the word lines to supply a high level voltage to the selected word line. The sense amplifier is coupled to the bit lines to amplify a data signal on the bit lines. The column switch couples one of the bit lines to a data bus.

The operation control circuit generates a word activation signal for operating the row decoder, a sense amplifier activation signal for operating the sense amplifier, and a column activation signal for operating the column switch. The internal voltage control circuit generates the regulator control signals in response to at least one of the word activation signal, the sense amplifier activation signal, and the column activation signal. With this structure, during a read operation or a write operation, for instance, it is possible to change the number of the operating regulators according to actual operations of the circuit blocks. As a result, it is possible to reduce variation in the internal power supply voltage to a minimum and an operating margin of the semiconductor integrated circuit can be improved.

In another embodiment, an internal circuit operates by receiving an internal power supply voltage. An internal voltage control circuit generates a plurality of regulator control signals according to a level of the internal power supply voltage. An internal voltage generation circuit has a plurality of regulators. The regulators operate in response to activation of the regulator control signals respectively to generate the internal power supply voltage by using an external power supply voltage. The internal voltage control circuit has a first and a second comparator and a voltage switch circuit. The first comparator outputs a first detection signal when the internal power supply voltage becomes higher than a first voltage. The second comparator outputs a second detection signal when the internal power supply voltage is lower than a second voltage which is lower than the first voltage.

A voltage switch circuit inactivates one of the regulator control signals to reduce the number of operating regulators among the regulators, every time the first detection signal is output, and activates one of the regulator control signals to increase the number of operating regulators among the regulators, every time the second detection signal is output. For example, every time the internal power supply voltage changes to become lower than the second voltage due to an increase in current consumption of the internal circuit, the number of the operating regulators increases by one. Further, every time the internal power supply voltage becomes higher than the first voltage due to a decrease in current consumption of the internal circuit, the number of the operating regulators decreases by one. In this manner, the number of the regulators supplying a current to the internal power supply line is changed not according to a level of the internal power supply voltage but according to a change in actual current consumption of the internal circuit. As a result, variation in the internal power supply voltage can be reduced to a minimum and an operating margin of the semiconductor integrated circuit can be improved.

For example, the internal voltage generation circuit includes a regulator which constantly operates to generate the internal power supply voltage by using the external power supply voltage. Therefore, for example, in a power-on period, the internal power supply voltage can be generated before the voltage switch circuit operates. Therefore, the operation states of the first and second comparators and the voltage switch circuit are quickly stabilized.

For example a monitor circuit has two resistors disposed in series between an internal power supply line to which the internal power supply voltage is supplied and a ground line, and outputs, from a coupling node of the resistors, a monitor voltage following the internal power supply voltage. A first reference voltage generation circuit generates a first reference voltage corresponding to the first voltage. A second reference voltage generation circuit generates a second reference voltage corresponding to the second voltage. The first comparator receives the monitor voltage and the first reference voltage as the internal power supply voltage and the first voltage to output the first detection signal. The second comparator receives the monitor voltage and the second reference voltage as the internal power supply voltage and the second voltage to output the second detection signal. The monitor voltage can be easily adjusted according to a resistance of the monitor circuit. Therefore, for example, it is possible to easily set the monitor voltage according to the specifications of the first and second reference voltage generation circuits already designed. Or, it is possible to easily set the monitor voltage according to the specifications of the first and second comparators already designed. As a result, it is possible to shorten a design period of the internal voltage control circuit. Further, since the resistor operates as a load circuit transferring an electric charge of the internal power supply line, the load circuit is not necessary.

In another embodiment, the regulators are different in supply capability for supplying a current to an internal power supply line to which the internal power supply voltage is supplied. The voltage switch circuit sequentially inactivates a regulator control signal corresponding to the regulator with the highest supply capability among the active regulator control signals every time the first detection signal is output. Further, the voltage switch circuit sequentially activates a regulator control signal corresponding to the regulator with the lowest supply capability among the inactive regulator control signals every time the second detection signal is output. With this structure, the voltage switch circuit can be formed by a simple logic circuit such as a shift resistor. As a result, chip size of the semiconductor integrated circuit can be reduced.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. A semiconductor integrated circuit comprising:
   a memory cell array including a plurality of memory cells, and a plurality of word lines and a plurality of bit lines coupled to the memory cells;
   an internal circuit including a plurality of circuit blocks to operate by receiving an internal power supply voltage and the circuit blocks including a row decoder to select one of the word lines to supply a high level voltage to a selected word line, a sense amplifier coupled to the bit lines to amplify a data signal on the bit lines, and a column switch to couple one of the bit lines to a data bus;
   an operation control circuit to generate a plurality of kinds of operation control signals to control operations of the row decoder, the sense amplifier and the column switch, respectively, according to an access request to access the memory cell,
   an internal voltage control circuit to generate a plurality of regulator control signals according to the operation control signals; and
   an internal voltage generation circuit including a plurality of regulators which operate in response to activation of the respective regulator control signals to generate the internal power supply voltage by using an external power supply voltage.

2. The semiconductor integrated circuit according to claim 1, wherein:
   the internal voltage generation circuit includes a plurality of load circuits which couple an internal power supply line supplied with the internal power supply voltage to a ground line, in response to activation of a plurality of load control signals respectively; and
   the internal voltage control circuit generates the regulator control signals and the load control signals according to the operation control signals.

3. The semiconductor integrated circuit according to claim 2, wherein
   the internal voltage control circuit generates the load control signals by using the regulator control signals.

4. The semiconductor integrated circuit according to claim 2, wherein:
   each of the load circuits includes a switch and a resistor element disposed in series between the internal power supply line and the ground line; and
   the switch turns on in response to activation of one of the load control signals.

5. The semiconductor integrated circuit according to claim 2, wherein:
   the load circuit with a low resistance includes a switch and a resistor element disposed in series between the internal power supply line and the ground line;
   the load circuit with a high resistance includes a switch and a transistor disposed in series between the internal power supply line and the ground line;
   the switches turn on in response to activation of the load control signals; and
   a gate of the transistor receives a voltage for turning on the transistor.

6. The semiconductor integrated circuit according to claim 1, further comprising
   a refresh control circuit to periodically generate a refresh request to refresh the memory cells, wherein
   the internal voltage control circuit generates the regulator control signals in response to the refresh request.

7. The semiconductor integrated circuit according to claim 1, wherein:
   the operation control circuit generates a word activation signal to operate the row decoder, a sense amplifier activation signal to operate the sense amplifier, and a column activation signal to operate the column switch; and
   the internal voltage control circuit generates the regulator control signals in response to at least one of the word activation signal, the sense amplifier activation signal, and the column activation signal.

* * * * *